United States Patent
Shibasaki et al.

(10) Patent No.: US 8,748,502 B2
(45) Date of Patent: Jun. 10, 2014

(54) PHOTOCURABLE RESIN COMPOSITION

(75) Inventors: Yoko Shibasaki, Saitama-ken (JP); Masao Arima, Saitama-ken (JP)

(73) Assignee: Taiyo Holdings Co., Ltd., Tokyo (JP)

( * ) Notice: Subject to any disclaimer, the term of this patent is extended or adjusted under 35 U.S.C. 154(b) by 30 days.

(21) Appl. No.: 13/383,324

(22) PCT Filed: Jul. 14, 2010

(86) PCT No.: PCT/JP2010/004572
§ 371 (c)(1),
(2), (4) Date: Jan. 10, 2012

(87) PCT Pub. No.: WO2011/007566
PCT Pub. Date: Jan. 20, 2011

(65) Prior Publication Data
US 2012/0111620 A1    May 10, 2012

(30) Foreign Application Priority Data
Jul. 15, 2009  (JP) .................... 2009-166925

(51) Int. Cl.
| | | |
|---|---|---|
| C08F 2/50 | (2006.01) |
| B29C 71/04 | (2006.01) |
| C08F 2/46 | (2006.01) |
| A61L 2/08 | (2006.01) |
| A61L 24/00 | (2006.01) |
| C08G 61/04 | (2006.01) |

(52) U.S. Cl.
USPC ...... 522/6; 522/71; 522/1; 522/189; 522/184; 520/1

(58) Field of Classification Search
USPC .............................. 522/71, 1, 189, 184; 520/1
See application file for complete search history.

(56) References Cited

U.S. PATENT DOCUMENTS

| 6,949,678 | B2 | 9/2005 | Kunimoto et al. |
| 7,381,842 | B2 | 6/2008 | Kunimoto et al. |
| 8,088,836 | B2 | 1/2012 | Taguchi |
| 8,101,336 | B2 | 1/2012 | Itoh et al. |
| 8,173,729 | B2 | 5/2012 | Youn et al. |
| 8,202,679 | B2 | 6/2012 | Sawamoto et al. |
| 2001/0012596 | A1 | 8/2001 | Kunimoto et al. |
| 2005/0191567 | A1 | 9/2005 | Kunimoto et al. |
| 2006/0241259 | A1* | 10/2006 | Tanabe et al. ................ 526/217 |
| 2008/0096133 | A1 | 4/2008 | Kato et al. |
| 2008/0148977 | A1* | 6/2008 | Sonokawa et al. ............ 101/465 |
| 2009/0029181 | A1* | 1/2009 | Shibasaki et al. ............. 428/457 |
| 2009/0194319 | A1 | 8/2009 | Itoh et al. |
| 2010/0188765 | A1 | 7/2010 | Matsumoto et al. |
| 2010/0210749 | A1 | 8/2010 | Taguchi |
| 2010/0222473 | A1 | 9/2010 | Youn et al. |
| 2010/0249262 | A1 | 9/2010 | Sawamoto et al. |

FOREIGN PATENT DOCUMENTS

| CN | 1299812 A | 6/2001 |
| CN | 101341172 A | 1/2009 |
| JP | 2004 264773 | 9/2004 |
| JP | 2005-097141 | * 4/2005 |
| JP | 2005 97141 | 4/2005 |
| JP | 2007 197340 | 8/2007 |
| JP | 2007 197390 | 8/2007 |
| JP | 2007 286138 | 11/2007 |
| JP | 2007 286140 | 11/2007 |
| JP | 4008273 | 11/2007 |
| JP | 4344400 | 10/2009 |
| JP | 2010-189279 A | 9/2010 |
| JP | 2010-189280 A | 9/2010 |
| JP | 2010-204661 A | 9/2010 |
| JP | 2012-48241 A | 3/2012 |
| WO | WO 2009/081483 A1 | 7/2009 |

OTHER PUBLICATIONS

International Search Report Issued Aug. 10, 2010 in PCT/JP/04572 Filed Jul. 14, 2010.
Notification of the First Office Action issued Dec. 5, 2012 in Chinese Patent Application No. 201080031323.7 (with English translation).
International Preliminary Report on Patentability and Written Opinion issued Feb. 7, 2012 in PCT/JP2010/004572.
U.S. Appl. No. 13/517,648, filed Jun. 14, 2012, Ito, et al.
Japanese Office Action Issued Jul. 31, 2012 in Patent Application No. 2009-166925 (with partial English translation).

* cited by examiner

Primary Examiner — Ling Choi
Assistant Examiner — Jessica E Whiteley
(74) Attorney, Agent, or Firm — Oblon, Spivak McClelland, Maier & Neustadt, L.L.P.

(57) ABSTRACT

Disclosed is a photocurable resin composition which comprises a photopolymerization initiator having two oxime ester groups in the molecule, a resin containing a carboxyl group, and a compound having two or more ethylenically unsaturated groups in the molecule. The composition can achieve high sensitivity, can provide a dried coating film having excellent touch dryness of fingers, can prevent the generation of an out gas during curing or the like, and can achieve all of excellent alignment accuracy, high productivity and high reliability in the formation of a solder resist for a printed wiring board or the like.

18 Claims, No Drawings

PHOTOCURABLE RESIN COMPOSITION

TECHNICAL FIELD

The present invention relates to a photocurable resin composition used for a solder resist or the like for a printed wiring board, for example.

BACKGROUND ART

Conventionally, for patterning a solder resist for a printed wiring board, a contact exposure method in which a photomask is in contact with a solder resist is mainly used. However, with an increasing density of a printed wiring board, from the viewpoint of obtaining excellent alignment accuracy, a (direct) exposure or a divided projection exposure which does not use a photomask is used in recent years.

The direct exposure carries out a light exposure by direct scanning of a laser beam or the like. The divided projection exposure repeatedly carries out a light exposure using a projection type exposure device while carrying out alignment in a small exposure area. Since a solder resist layer on a patterned wiring board is subjected to scanning or repetitive exposure, a conventional solder resist having an appropriate exposure amount of 200 mJ/cm² or more has a problem in that it takes a long period of time to perform exposure.

For this reason, a solder resist composition is suggested which can exhibit high photopolymerization performance. For example, disclosed in Patent Literature 1 is a photoresist ink obtained by adding an acrylic acid and further adding an acid anhydride to an epoxy group-containing polymer like a copolymer between glycidyl methacrylate and methyl methacrylate so as to produce a carboxyl group, and by consequently reacting the carboxyl group with 4-hydroxybutyl glycidyl acrylate. However, as the side chain molecule is very long compared to the main chain and also it is branched, there is a problem in that touch dryness of fingers of a dried coating film is extremely poor.

Further, disclosed in Patent Literatures 2 and 3 is a solder resist composition in which an oxime ester initiator is used as a photopolymerization initiator. With such solder resist composition, a good touch dryness of fingers can be obtained. However, according to the exposure method like the direct exposure, the sensitivity of a composition has a huge influence on the productivity, and therefore ultra-high sensitivity is required more than ever. There is also a problem that components of a photopolymerization initiator are volatilized as an out gas to cause contamination.

For example, according to the direct exposure or the divided projection exposure in which a photomask is not brought into contact with a solder resist layer, there is a possibility that the components of a photopolymerization initiator volatilize as an out gas during an exposure, thereby contaminating optical elements within an exposure device. Further, to obtain good solder heat resistance, post-curing like thermal curing or UV exposure is generally carried out after developing the solder resist layer, and mounting is carried out by re-flow during a post process. At that time, the components of a photopolymerization initiator volatilize as an out gas, cool, and solidify to serve as a cause for contamination of a work environment.

Under the circumstances, various methods to suppress an out gas are studied (for example, see Patent Literature 4 and the like). However, according to high densification and high performance of a printed board, further suppression of contamination is required and it is required more and more to suppress the generation of an out gas.

CITATION LIST

Patent Literature

PLT 1: Japanese Patent Application Laid-Open No. 2004-264773 (claims)

PLT 2: Japanese Patent Application Laid-Open No. 2007-286138 (claims)

PLT 3: Japanese Patent Application Laid-Open No. 2007-286140 (claims)

PLT 4: Japanese Patent No. 4008273

SUMMARY OF THE INVENTION

Technical Problem

An object of the invention is to provide a photocurable resin composition which can achieve high sensitivity, can provide a dried coating film having excellent touch dryness of fingers, can prevent the generation of an out gas during curing or the like, and also can achieve all of excellent alignment accuracy, high productivity and high reliability in the formation of a solder resist for a printed wiring board, for example.

Solution to Problem

According to one preferred aspect of the invention, a photocurable resin composition which is characterized by containing a photopolymerization initiator having two oxime ester groups in the molecule, a resin containing a carboxyl group, and a compound having two or more ethylenically unsaturated groups in the molecule is provided.

According to the constitution described above, it becomes possible to achieve high sensitivity, to obtain a dried coating film having excellent touch dryness of fingers, to prevent the generation of an out gas during curing or the like, and also to suppress the contamination, to achieve all of excellent alignment accuracy, high productivity and high reliability in the formation of a solder resist for a printed wiring board or the like.

Further, in the photocurable resin composition according to one preferred aspect of the invention, the photopolymerization initiator preferably has a carbazole structure. By having a carbazole structure, a carbazole dimer having a large molecular weight and reduced volatility is yielded after radical generation (photo-cleavage) from an oxime ester group caused by light irradiation, and therefore it becomes possible to suppress the generation of an out gas.

Further, for the photocurable resin composition according to one preferred aspect of the invention, the photopolymerization initiator is preferably an oxime ester compound represented by the following formula (I)

[Chemical Formula 1]

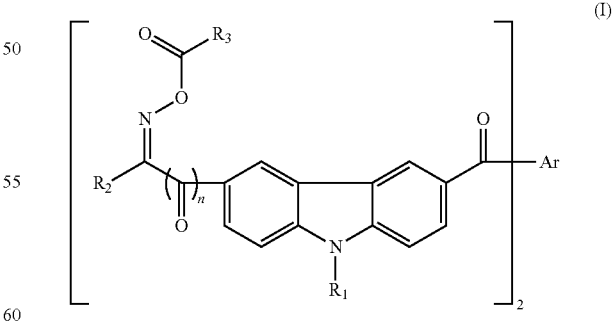

(in the formula, $R_1$ represents a hydrogen atom, an alkyl group having 1 to 17 carbon atoms, an alkoxy group having 1 to 8 carbon atoms, a phenyl group, a phenyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), a naphthyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), $R_2$ and $R_3$ each represent a hydrogen atom, an alkyl group having 1 to 17 carbon atoms, an alkoxy group having 1 to 8 carbon atoms, a halogen group, a phenyl group, a phenyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), a naphthyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), an anthryl group, a pyridyl group, a benzofuryl group, or a benzothienyl group, Ar is a bond or represents alkylene having 1 to 10 carbon atoms, vinylene, phenylene, biphenylene, pyridylene, naphthylene, anthrylene, thienylene, furylene, 2,5-pyrrole-diyl, 4,4'-stilbene-diyl, or 4,2'-styrene-diyl, and n represents an integer of 0 to 1). By using this oxime ester compound, volatilization is further reduced and it becomes possible to suppress contamination caused by an out gas.

Further, in the photocurable resin composition according to one preferred aspect of the invention, a thermocurable resin is preferably contained. By containing a thermocurable component, heat resistance can be further improved.

Further, in the photocurable resin composition according to one preferred aspect of the invention, a colorant is preferably contained. By containing a colorant, the composition can be suitably used as a solder resist.

Further, by coating the photocurable resin composition according to one preferred aspect of the invention on a film and drying, a dried film can be obtained. Without coating the photocurable resin composition on a substrate, a resist layer can be easily formed.

Still further, by coating the photocurable resin composition according to one preferred aspect of the invention on a substrate and drying, or laminating on a substrate a dried film formed by coating the composition on a film and then photocuring it by irradiation of active energy ray, a cured product with good characteristics can be obtained even with irradiation with low energy. In addition, it becomes also possible to suppress contamination caused by generation of an out gas during curing or a following process like re-flow or the like. In addition, with application of direct exposure or the like, a printed wiring board having excellent alignment accuracy and high productivity can be provided.

Advantageous Effects of Invention

According to the invention, a photocurable resin composition which can achieve high sensitivity, can provide a dried coating film having excellent touch dryness of fingers, can prevent the generation of an out gas during curing or the like, and also can suppress contamination and can achieve all of excellent alignment accuracy, high productivity and high reliability in the formation of a solder resist for a printed wiring board or the like can be provided.

DESCRIPTION OF EMBODIMENTS

Herein below, preferred embodiments of the invention are explained in greater detail.

The photocurable resin composition of the invention is characterized by containing a photopolymerization initiator having two oxime ester groups in the molecule, a resin containing a carboxyl group, and a compound having two or more ethylenically unsaturated groups in the molecule.

By using the photopolymerization initiator having two oxime ester groups in the molecule, a highly sensitive photocurable resin composition can be obtained. Further, it becomes also possible to suppress generation of an out gas during curing and a following process (heating process) like re-flow or the like.

As explained in detail above, although generation of an out gas is suppressed to a certain level with single oxime ester per molecule, the generation of an out gas can be further suppressed by the photopolymerization initiator of an embodiment of the invention. It is believed that the photopolymerization initiator of an embodiment of the invention has very high sensitivity so that the same or higher sensitivity is obtained even with a small addition amount and, by having two oxime ester groups in the molecule, it is introduced to the network as a crosslinking point at the time of reaction with an ethylenically unsaturated double bond.

Specifically, it functions as a photocleavable intermolecular crosslinking type photopolymerization initiator which reacts as a bifunctional functional group between resins containing a carboxyl group having an ethylenically unsaturated group or molecules of a compound containing an ethylenically unsaturated group.

Specific examples thereof include an oxime ester compound represented by the following formula (I) in which a carbazole structure is contained.

[Chemical Formula 2]

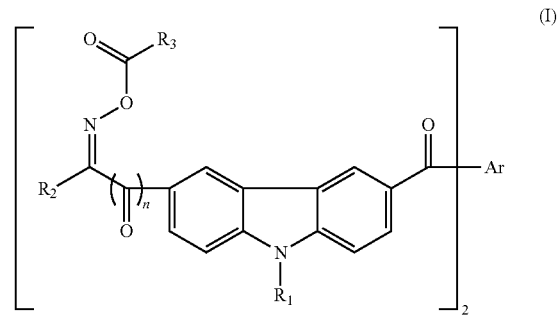

(in the formula, $R_1$ represents a hydrogen atom, an alkyl group having 1 to 17 carbon atoms, an alkoxy group having 1 to 8 carbon atoms, a phenyl group, a phenyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), a naphthyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), $R_2$ and $R_3$ each represent a hydrogen atom, an alkyl group having 1 to 17 carbon atoms, an alkoxy group having 1 to 8 carbon atoms, a halogen group, a phenyl group, a phenyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), a naphthyl group (substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms), an anthryl group, a pyridyl group, a benzofuryl group, or a benzothienyl group, Ar is a bond or represents alkylene having 1 to 10 carbon atoms, vinylene, phenylene, biphenylene, pyridylene, naphthylene, anthrylene, thienylene, furylene, 2,5-pyrrole-diyl, 4,4'-stilbene-diyl, or 4,2'-styrene-diyl, and n represents an integer of 0 to 1).

By using the oxime ester compound, volatilization is further reduced so that it becomes possible to suppress the contamination caused by an out gas. It is believed to be due to the fact that radical generation (photo-cleavage) caused by light irradiation occurs on the oxime ester group and the remaining carbazole dimer is a compound having relatively big molecular weight compared to a conventional photopolymerization initiator.

Further, it is preferable that, in the formula (I), $R_1$ and $R_2$ each are a methyl group or an ethyl group, $R_3$ is methyl or phenyl, Ar is a bond or represents phenylene, naphthylene, or thienylene, and n is 0.

Addition amount of the photopolymerization initiator is preferably 0.01 to 5 parts by weight compared to 100 parts by weight of the resin containing a carboxyl group. When it is greater than 5 parts by weight, light absorption is high and photoreactivity of a bottom part of a resist is lowered to cause an occurrence of an undercut and also touch dryness of fingers is deterioirated. On the other hand, when it is less than 0.01 part by weight, photocurability on copper is insufficient to cause peeling of a coating film and also characteristics of a coating film like chemical resistance or the like are deteriorated. More preferably, the addition amount is 0.1 to 3 parts by weight.

The resin containing a carboxyl group in the photocurable resin composition of this embodiment of the invention is used to give an alkali developability, and a known resin containing a carboxyl group in the molecule may be used. In particular, from the viewpoint of photocurability and resistance to development, a resin containing a carboxyl group which has an ethylenically unsaturated double bond in the molecule is preferable. In addition, it is more preferable that the unsaturated double bond is derived from acrylic acid, methacrylic acid, or a derivative thereof. Herein below, specific examples thereof are given.

(1) A resin containing a carboxyl group which is obtained by copolymerization between an unsaturated carboxylic acid like (meth)acrylic acid and a compound containing an unsaturated group like styrene, α-methylstyrene, lower alkyl (meth)acrylate, and isobutylene.

(2) A urethane resin containing a carboxyl group which is obtained by polyaddition of diisocyanate like aliphatic diisocyanate, branched aliphatic diisocyanate, alicyclic diisocyanate, and aromatic diisocyanate with a diol compound including a dialcohol compound containing a carboxyl group like dimethylol propionic acid and dimethylol butanoic acid, and polycarbonate-based polyol, polyether-based polyol, polyester-based polyol, polyolefine-based polyol, acryl-based polyol, bisphenol A type alkylene oxide adduct diol, and a compound having a phenolic hydroxyl group and an alcoholic hydroxyl group.

(3) A urethane resin containing a terminal carboxyl group obtained by reacting acid anhydride with the terminal of a urethane resin obtained by polyaddition of diisocyanate compound like aliphatic diisocyanate, branched aliphatic diisocyanate, alicyclic diisocyanate, and aromatic diisocyanate with a diol compound including polycarbonate-based polyol, polyether-based polyol, polyester-based polyol, polyolefine-based polyol, acryl-based polyol, bisphenol A type alkylene oxide adduct diol, and a compound having a phenolic hydroxyl group and an alcoholic hydroxyl group.

(4) A photosensitive urethane resin containing a carboxyl group which is obtained by polyaddition of diisocyanate with (meth)acrylate or partial acid anhydride-modified product of a bifunctional epoxy resin like bisphenol A type epoxy resin, hydrogenated bisphenol A type epoxy resin, bisphenol F type epoxy resin, bisphenol S type epoxy resin, bixylenol type epoxy resin and biphenol type epoxy resin, a dialcohol compound containing a carboxyl group, and a diol compound.

(5) A urethane resin containing a carboxyl group obtained by adding, during synthesis of the resin (2) or (4) above, a compound having one hydroxy group and at least one (meth)acryloyl group in the molecule like hydroxyalkyl(meth)acrylate to have a terminal (meth)acrylate.

(6) A urethane resin containing a carboxyl group obtained by adding, during synthesis of the resin (2) or (4) above, a compound having one isocyanate group and at least one (meth)acryloyl group in the molecule like molar reactant between isophorone diisocyanate and pentaerythritol triacrylate to have a terminal (meth)acrylate.

(7) A photosensitive resin containing a carboxyl group obtained by reacting a bifunctional or polyfunctional (solid) epoxy resin described below with (meth)acrylic acid and adding to the hydroxy group in the side chain a dibasic acid anhydride like phthalic anhydride, teterahydrophthalic anhydride, and hexahydrophthalic anhydride.

(8) A photosensitive resin containing a carboxyl group obtained by reacting a polyfunctional epoxy resin, in which hydroxy group of a bifunctional (solid) epoxy resin is further epoxylated with epichlorohydrin as described below, with (meth)acrylic acid and adding to the hydroxy group generated a dibasic acid anhydride.

(9) A photosensitive resin containing a carboxyl group obtained by adding a cyclic ether like ethylene oxide or cyclic carbonate like propylene carbonate to a polyfunctional phenol compound like Novolac, partially esterifying the hydroxy group obtained with (meth)acrylic acid, and reacting the remaining hydroxy groups with a polybasic acid anhydride.

(10) A photosensitive resin containing a carboxyl group obtained by adding a compound having one epoxy group and at least one (meth)acryloyl group in the molecule like glycidyl(meth)acrylate, α-methylglycidyl(meth)acrylate to the resins of (1) to (9) above.

The resin containing a carboxyl group is not limited to those described above. It may be used either singly or in combination of two or more.

As used herein, the term "(meth)acrylate" includes acrylate, methacrylate, and a mixture thereof. The same holds true for other similar expressions.

With the resin containing a carboxyl group, many free carboxyl groups are present in the backbone side chain of the polymer to enable development by a dilute aqueous alkali solution.

Acid value of the resin containing a carboxyl group is 40 to 200 mgKOH/g. When it is less than 40 mgKOH/g, it is difficult to achieve alkali development. On the other hand, when it is more than 200 mgKOH/g, an exposed section is dissolved by a development liquid, yielding unnecessarily thin lines. As a result, the exposed section and unexposed section are all dissolved and released by a development liquid depending on a case, and thus it becomes difficult to write a normal resist pattern. More preferably, the acid value is 45 to 120 mgKOH/g.

Further, although it may vary depending on resin skeleton, in general, weight average molecular weight of the resin containing a carboxyl group is preferably 2,000 to 150,000. When the weight average molecular weight is less than 2,000, a tack-free property may be lowered so that moisture resistance of a coating film is poor after exposure and developability may be significantly lowered due to film loss during development. On the other hand, when the weight average molecular weight is more than 150,000, developability may be significantly lowered and storage stability tends to deteriorate. The weight average molecular weight is more preferably 5,000 to 100,000.

Addition amount of the resin containing a carboxyl group is appropriately 20 to 80% by mass in a photocurable resin composition. When it is less than 20% by mass, film strength is weakened. On the other hand, when it is more than 60% by mass, the composition has higher viscosity, yielding poorer coatability or the like. The addition amount is more preferably 30 to 60% by mass.

In the photocurable resin composition according to this preferred embodiment of the invention, the compound having two or more ethylenically unsaturated groups in the molecule is photo-cured by irradiation of active energy ray and used to insolubilize the resin containing a carboxyl group in an aqueous alkali solution or to help the insolubilization of the resin.

Examples of the compound include diacrylates of glycol like ethylene glycol, methoxytetraethylene glycol, polyethylene glycol, and propylene glycol; polyvalent acrylates with a polyhydric alcohol like hexanediol, trimethylol propane, pentaerythritol, dipentaerythritol, and tris-hydroxyethyl isocyanurate, or an ethylene oxide or propylene oxide adduct thereof; polyvalent acrylates like phenoxyacrylate, bisphenol A diacrylate and an ethylene oxide or propylene oxide adduct of the phenols; polyvalent acrylates of glycidyl ether like glycerin diglycidyl ether, glycerin triglycidyl ether, trimethylol propane triglycidyl ether, and triglycidyl isocyanurate, and; urethane acrylate, melamine acrylate, and/or methacrylates corresponding to each acrylate.

Further examples include an epoxy acrylate resin wherein a polyfunctional epoxy resin like cresol Novolac type epoxy resin is reacted with acrylic acid and an epoxy urethane acrylate compound in which the hydroxy group of the epoxy acrylate resin is reacted with hydroxyacrylate like pentaerythritol triacrylate and a half urethane compound of diisocyanate like isophorone diisocyanate. These epoxy acrylate resins can enhance the photocurability without lowering touch dryness of fingers.

Addition amount of the compound above is preferably 5 to 100 parts by mass compared to 100 parts by mass of the resin containing a carboxyl group. When it is less than 5 parts by mass, photocurability is lowered and it is difficult to form a pattern by alkali development after irradiation with active energy ray. On the other hand, when it is more than 100 parts by mass, solubility in an aqueous alkali solution is lowered, yielding a soft coating film. The addition amount is more preferably 1 to 70 parts by mass.

In the photocurable resin composition according to this preferred embodiment of the invention, a photopolymerization initiator other than the photopolymerization initiator having two oxime ester groups in the molecule as described above can be also used.

For example, at least one photopolymerization initiator selected from a group consisting of an oxime ester-based photopolymerization initiator having one oxime ester group per molecule, an α-aminoacetophenone-based photopolymerization initiator, and an acylphosphine oxide-based photopolymerization initiator can be used.

Examples of the oxime ester-based photopolymerization initiator include CGI-325, IRGACURE (registered trademark) OXE01, and IRGACURE OXE02, all manufactured by BASF, Japan, and N-1919 manufactured by ADEKA CORPORATION as a commercially available product. The oxime ester-based photopolymerization initiator may be used either singly or in combination of two or more.

Addition amount of the oxime ester-based photopolymerization initiator is preferably 0.01 to 5 parts by mass compared to 100 parts by mass of the resin containing a carboxyl group. When it is less than 0.01 part by mass, photocurability on copper is insufficient to yield peeling of a coating film and also characteristics of the coating film like chemical resistance are lowered. On the other hand, when it is more than 5 parts by mass, an effect of reducing an out gas is not obtained and light absorption on surface of a solder resist coating film is so strong that deep curing property tends to decrease. The addition amount is more preferably 0.5 to 3 parts by mass.

Specific examples of the α-aminoacetophenone-based photopolymerization initiator include 2-methyl-1-[4-(methylthio)phenyl]-2-morpholinopropanone-1,2-benzyl-2-dimethylamino-1-(4-morpholino phenyl)-butan-1-one, 2-(dimethylamino)-2-[(4-methylphenyl)methyl]-1-[4-(4-morpholinyl)phenyl]-1-butanone, and N,N-dimethylaminoacetophenone. Examples of a commercially available product include IRGACURE 907, IRGACURE 369, and IRGACURE 379 manufactured by BASF, Japan.

Specific examples of the acylphosphine oxide-based photopolymerization initiator include 2,4,6-trimethylbenzoyl diphenylphosphine oxide, bis(2,4,6-trimethylbenzoyl)-phenylphosphine oxide, and bis(2,6-dimethoxybenzoyl)-2,4,4-trimethyl-pentylphosphine oxide. Examples of a commercially available product include LUCIRIN TPO manufactured by BASF and IRGACURE 819 manufactured by BASF, Japan.

Addition amount of the α-aminoacetophenone-based photopolymerization initiator and acylphosphine oxide-based photopolymerization initiator is preferably 0.01 to 15 parts by mass compared to 100 parts by mass of the resin containing a carboxyl group. When it is less than 0.01 part by mass, photocurability on copper is insufficient to yield peeling of a coating film and also characteristics of the coating film like chemical resistance are lowered. On the other hand, when it is more than 15 parts by mass, an effect of reducing an out gas is not obtained and light absorption on surface of a solder resist coating film is so strong that deep curing property tends to decrease. The addition amount is more preferably 0.5 to 10 parts by mass.

In addition to the above, examples of a photopolymerization initiator, a photo initiation aid, and a sensitizer that can be suitably used for the photocurable resin composition of the embodiment of the invention include a benzoin compound, an acetophenone compound, an anthraquinone compound, a thioxanthone compound, a ketal compound, a benzophenone compound, a tertiary amine compound, and a xanthone compound.

Specific examples of the benzoin compound include benzoin, benzoin methyl ether, benzoin ethyl ether, and benzoin isopropyl ether.

Specific examples of the acetophenone compound include acetophenone, 2,2-dimethoxy-2-phenyl acetophenone, 2,2-diethoxy-2-phenylacetophenone, and 1,1-dichloroacetophenone.

Specific examples of the anthraquinone compound include 2-methylanthraquinone, 2-ethylanthraquinone, 2-t-butylanthraquinone, and 1-chloroanthraquinone.

Specific examples of the thioxanthone compound include 2,4-dimethylthioxanthone, 2,4-diethylthioxanthone, 2-chlorothioxanthone, and 2,4-diisopropylthioxanthone.

Specific examples of the ketal compound include acetophenone dimethyl ketal and benzyl dimethyl ketal.

Specific examples of the benzophenone compound include benzophenone, 4-benzoyldiphenyl sulfide, 4-benzoyl-4'-methyldiphenyl sulfide, 4-benzoyl-4'-ethyldiphenyl sulfide, and 4-benzoyl-4'-propyl diphenyl sulfide.

Specific examples of the tertiary amine compound include an ethanolamine compound, a compound having a dialkylaminobenzene structure, and examples of a commercially available product include dialkylaminobenzophenone like 4,4'-dimethylaminobenzophenone (Nisso Cure (registered trademark) MABP, manufactured by Nippon Soda Co., Ltd.) and 4,4'-diethylaminobenzophenone (EAB, manufactured by HODOGAYA CHEMICAL CO., LTD.), a coumarin compound containing a dialkylamino group like 7-(diethylamino)-4-methyl-2H-1-benzopyran-2-one (7-(diethylamino)-4-methylcoumarin), ethyl 4-dimethylamino benzoate (KAYACURE (registered trademark) EPA, manufactured by Nippon Kayaku Co., Ltd.), ethyl 2-dimethylamino benzoate (Quantacure DMB, manufactured by International Bio-synthetics Ltd.), (n-butoxy)ethyl 4-dimethylamino benzoate (Quantacure BEA, manufactured by International Bio-synthetics Ltd.), p-dimethylamino benzoic acid isoamylethyl ester (KAYACURE DMBI, manufactured by Nippon Kayaku Co., Ltd.), 2-ethylhexyl 4-dimethylamino benzoate (Esolol 507, manufactured by Van Dyk), and 4,4'-diethylaminobenzophenone (EAB, manufactured by HODOGAYA CHEMICAL CO., LTD.).

Of these, the thioxanthone compounds and the tertiary amine compounds are preferable. In particular, it is preferable to contain the thioxanthone compound from the viewpoint of deep curability. Among them, it is preferable to contain the thioxanthone compound like 2,4-dimethylthioxanthone, 2,4-diethylthioxanthone, 2-chlorothioxanthone, and 2,4-diisopropylthioxanthone.

Addition amount of the thioxanthone compound is preferably 20 parts by mass or less compared to 100 parts by mass of the resin containing a carboxyl group. When it is more than 20 parts by mass, thick film curability is lowered and also production cost increases. More preferably, it is 10 parts by mass or less.

Further, a compound having a dialkylaminobenzene structure is preferable as a tertiary amine compound. Among them, a dialkylaminobenzophenone compound, a coumarin compound containing a dialkylamino group with maximum absorption wavelength of 350 to 450 nm, and ketocoumarins are particularly preferable.

As a dialkylaminobenzophenone compound, 4,4'-diethylaminobenzophenone is preferable as it has low toxicity. As the coumarin compound containing a dialkylamino group has maximum absorption wavelength of 350 to 410 nm, which is within a UV range, it can provide a colorless and transparent photocurable composition and also, by using a coloring pigment, a colored solder resist film in which the color of the coloring pigment itself is reflected. In particular, 7-(diethylamino)-4-methyl-2H-1-benzopyran-2-one is preferable in that it shows an excellent sensitizing effect for laser light with wavelength of 400 to 410 nm.

Addition amount of the tertiary amine compound is preferably 0.1 to 20 parts by mass compared to 100 parts by mass of the resin containing a carboxyl group. When the addition amount of the tertiary amine compound is less than 0.1 part by mass, it appears to be difficult to obtain a sufficient sensitizing effect. When it is more than 20 parts by mass, light absorption by a tertiary amine compound on surface of a solder resist coating film is so strong that deep curing property tends to decrease. The addition amount is more preferably 0.1 to 10 parts by mass.

The photopolymerization initiator, photoinitiation aid, and sensitizer may be used either singly or in combination of two or more.

Total amount of the photopolymerization initiator, photoinitiation aid, and sensitizer is preferably 35 parts by mass or less compared to 100 parts by mass of the resin containing a carboxyl group. When it is more than 35 parts by mass, deep curing property tends to decrease due to light absorption by them.

Further, as the photopolymerization initiator, photoinitiation aid, and sensitizer absorb light with specific wavelength, sensitivity may be lowered and it may function as a UV absorbing agent depending on a case. However, they are used not only for enhancing the sensitivity of the composition. If necessary, it is also possible that, with absorption of light with specific wavelength, photoreactivity on surface is increased, and at the same time line shape of a resist and opening are converted to a vertical type, a tapered type, or a reverse tapered type, and line width or machining precision of opening diameter can be improved.

For the photocurable resin composition of the preferred embodiment of the invention, N phenyl glycines, phenoxyacetic acids, thiophenoxy acetic acids, and mercaptothiazole and the like that are well known in the field may be used as a chain transfer agent to enhance the sensitivity of the composition.

Specific examples thereof include a chain transfer agent having a carboxyl group like mercaptosuccinic acid, mercaptoacetic acid, mercaptopropionic acid, methionine, cysteine, thiosalicylic acid and derivatives thereof; a chain transfer agent having a hydroxy group like mercaptoethanol, mercaptopropanol, mercaptobutanol, mercaptopropane diol, mercaptobutane diol, hydroxybenzene thiol and derivatives thereof, and; 1-butanethiol, butyl-3-mercaptopropionate, methyl-3-mercaptopropionate, 2,2-(ethylenedioxy)diethanethiol, ethanethiol, 4-methylbenzene thiol, dodecylmercaptan, propane thiol, butane thiol, pentane thiol, 1-octane thiol, cyclopentane thiol, cyclohexane thiol, thioglycerol, and 4,4-thiobisbenzene thiol.

Further, a polyfunctional mercaptan-based compound can be used, and specific examples thereof include aliphatic thiols like hexane-1,6-dithiol, decane-1,10-dithiol, dimercapto diethyl ether, and dimercapto diethyl sulfide; aromatic thiols like xylylene dimercaptan, 4,4'-dimercaptodiphenyl sulfide, and 1,4-benzenedithiol; poly(mercaptoacetate) of polyhydric alcohol like ethylene glycol bis(mercaptoacetate), polyethylene glycol bis(mercaptoacetate), propylene glycol bis(mercaptoacetate), glycerin tris(mercaptoacetate), trimethylolethane tris(mercaptoacetate), trimethylol propanetris (mercaptoacetate), pentaerythritoltetrakis(mercaptoacetate), and dipentaerythritolhexakis(mercaptoacetate); poly(3-mercaptopropionate) of polyhydric alcohol like ethylene glycol bis(3-mercaptopropionate), polyethylene glycol bis(3-mercaptopropionate), propylene glycol bis(3-mercaptopropionate), glycerin tris(3-mercaptopropionate), trimethylolethane tris(mercaptopropionate), trimethylol propanetris(3-mercaptopropionate), pentaerythritoltetrakis(3-mercaptopropionate), and dipentaerythritolhexakis(3-mercaptopropionate), and; poly(mercaptobutyrate) like 1,4-bis(3-mercaptobutyryloxy)butane, 1,3,5-tris(3-mercaptobutyloxyethyl)-1,3,5-triazine-2,4,6(1H, 3H, 5H)-trione, and pentaerythritoltetrakis(3-mercaptobutyrate).

Further, a heterocyclic compound having a mercapto group can be used, and specific examples thereof include mercapto-4-butyrolactone (other name: 2-mercapto-4-butanolide), 2-mercapto-4-methyl-4-butyrolactone, 2-mercapto-4-ethyl-4-butyrolactone, 2-mercapto-4-butyrothiolactone, 2-mercapto-4-butyrolactam, N-methoxy-2-mercapto-4-butyrolactam, N-ethoxy-2-mercapto-4-butyrolactam, N-methyl-2-mercapto-4-butyrolactam, N-ethyl-2-mercapto-4-butyrolactam, N-(2-methoxy)ethyl-2-mercapto-4-butyrolactam, N-(2-ethoxy)ethyl-2-mercapto-4-butyrolactam, 2-mercapto-5-valerolactone, 2-mercapto-5-valerolactam, N-methyl-2-mercapto-5-valerolactam, N-ethyl-2-mercapto-5-valerolactam, N-(2-methoxy)ethyl-2-mercapto-5-valerolactam, N-(2-ethoxy)ethyl-2-mercapto-5-valerolactam, and 2-mercapto-6-hexanolactam.

The heterocyclic compound having a mercapto group is preferable in that it does not inhibit the develop ability of the photocurable resin composition. Specifically preferred examples thereof include mercaptobenzothiazole, 3-mercapto-4-methyl-4H-1,2,4-triazole, 5-methyl-1,3,4-thiadiazole-2-thiol, and 1-phenyl-5-mercapto-1H-tetrazole.

The chain transfer agent may be used either singly or in combination of two or more.

Total amount of the chain transfer agent is preferably within the range of 5 parts by mass or less compared to 100 parts by mass of the resin containing a carboxyl group. When it is more than 5 parts by mass, not only an increase in the sensitivity cannot be obtained with addition of an excess amount but also the developability tends to be lowered due to their reaction with an ethylenically unsaturated group.

To provide the composition with heat resistance, it is possible to add a thermocurable resin to the photocurable resin composition of the preferred embodiment of the invention. Specific examples thereof include a thermocurable resin well known in the field including a compound having two or more cyclic ether groups and/or cyclic thio ether groups (herein below, described as "cyclic (thio)ether group") in the molecule like a polyfunctional epoxy compound, a polyfunctional oxetane compound, and an episulfide resin, a compound having two or more isocyanate groups or blocked isocyanate groups in the molecule like a polyisocyanate compound and a blocked isocyanate compound, an amine resin like a melamine resin and a benzoguanamine resin, and derivatives thereof, bismaleimide, oxazine, a cyclocarbonate compound, and a carbodiimide resin.

Particularly preferred is a thermocurable resin having two or more cyclic (thio)ether groups in the molecule. Such thermocurable resin having two or more cyclic (thio)ether groups in the molecule is a compound which has two or more groups that are at least one type of a 3-, 4-, or 5-membered cyclic ether group and a cyclic thio ether group in the molecule. Examples thereof include a compound having two or more epoxy groups in the molecules, i.e., a polyfunctional epoxy compound, a compound having two or more oxetanyl groups in the molecules, i.e., a polyfunctional oxetane compound, and a compound having two or more episulfide groups in the molecules, i.e., an episulfide resin.

Examples of the commercially available polyfunctional epoxy compound include bisphenol A type epoxy resin including jER (registered trademark) 828, jER834, jER1001, and jER1004 manufactured by Mitsubishi Chemical Corporation, EPICLON (registered trademark) 840, EPICLON850, EPICLON1050, and EPICLON2055 manufactured by DIC Corporation, EPOTOHTO (registered trademark) YD-011, YD-013, YD-127, and YD-128 manufactured by NSCC EPDXY MANUFACTURING CO., LTD., D.E.R. 317, D.E.R. 331, D.E.R. 661, and D.E.R. 664 manufactured by The Dow Chemical Company, ARALDITE 6071, ARALDITE 6084, ARALDITE GY250, and ARALDITE GY260 manufactured by Huntsman Advanced Materials K.K., SUMI-EPDXY (registered trademark) ESA-011, ESA-014, ELA-115, and ELA-128 manufactured by Sumitomo Chemical Co. Ltd., A.E.R. 330, A.E.R. 331, A.E.R. 661, and A.E.R. 664 manufactured by Asahi Kasei Corporation; a brominated epoxy resin like jERYL903 manufactured by Mitsubishi Chemical Corporation, EPICLON 152 and EPICLON 165 manufactured by DIC Corporation, EPOTOHTO YDB-400 and YDB-500 manufactured by NSCC EPDXY MANUFACTURING CO., LTD., D.E.R. 542 manufactured by The Dow Chemical Company, ARALDITE 8011 manufactured by BASF Japan, SUMI-EPDXY ESB-400 and ESB-700 manufactured by Sumitomo Chemical Co. Ltd., and A.E.R. 711 and A.E.R. 714 manufactured by Asahi Kasei Corporation; a Novolac type epoxy resin including jER152 and jER154 manufactured by Mitsubishi Chemical Corporation, D.E.N. 431 and D.E.N. 438 manufactured by The Dow Chemical Company, EPICLON N-730, EPICLON N-770, and EPICLON N-865 manufactured by DIC Corporation, EPOTOHTO YDCN-701 and YDCN-704 manufactured by NSCC EPDXY MANUFACTURING CO., LTD., ARALDITE ECN1235, ARALDITE ECN1273, ARALDITE ECN1299, and ARALDITE XPY307 manufactured by BASF Japan, EPPN (registered trademark)-201, EOCN-1025, EOCN-1020, EOCN-104S, and RE-306 manufactured by Nippon Kayaku Co., Ltd., SUMI-EPDXY ESCN-195× and ESCN-220 manufactured by Sumitomo Chemical Co. Ltd., and A.E.R. ECN-235 and ECN-299 manufactured by Asahi Kasei Corporation; a bisphenol F type epoxy resin including EPICLON830 manufactured by DIC Corporation, jER807 manufactured by Mitsubishi Chemical Corporation, EPOTOHTO YDF-170, YDF-175, and YDF-2004, manufactured by NSCC EPDXY MANUFACTURING CO., LTD., and ARALDITE XPY306 manufactured by BASF Japan; hydrogenated bisphenol A type epoxy resin including EPOTOHTO ST-2004, ST-2007, and ST-3000 manufactured by NSCC EPDXY MANUFACTURING CO., LTD.; a glycidylamine type epoxy resin including jER604 manufactured by Mitsubishi Chemical Corporation, EPOTOHTO YH-434 manufactured by NSCC EPDXY MANUFACTURING CO., LTD., ARALDITE MY720 manufactured by BASF Japan, and SUMI-EPDXY ELM-120 manufactured by Sumitomo Chemical Co. Ltd.; a hydantoin type epoxy resin including ARALDITE CY-350 manufactured by BASF Japan; an alicyclic epoxy resin including CELLOXIDE (registered trademark) 2021 manufactured by DAICEL CHEMICAL INDUSTRIES, LTD., ARALDITE CY175 and CY179 manufactured by BASF Japan; a trihydroxyphenylmethane type epoxy resin including YL-933 manufactured by Mitsubishi Chemical Corporation, T.E.N., EPPN-501, and EPPN-502 manufactured by The Dow Chemical Company; a bixylenol type or biphenol type epoxy resin including YL-6056, YX-4000, and YL-6121 manufactured by Mitsubishi Chemical Corporation, and a mixture thereof; a bisphenol S type epoxy resin including EBPS-200 manufactured by Nippon Kayaku Co., Ltd., EPX-30 manufactured by ADEKA CORPORATION, and EXA-1514 manufactured by DIC Corporation; bisphenol A Novolac type epoxy resin including jER157S manufactured by Mitsubishi Chemical Corporation; a tetraphenylolethane type epoxy resin including jERYL-931 manufactured by Mitsubishi Chemical Corporation and ARALDITE 163 manufactured by BASF Japan; a heterocycle type epoxy resin including ARALDITE PT810 manufactured by BASF Japan and TEPIC (registered trademark) manufactured by Nissan Chemical Industries, Ltd.; a diglycidyl phthalate resin including BLEMMER (registered trademark) DGT manufactured by NOF CORPORATION; a tetraglycidyl xylenolethane resin including ZX-1063 manufactured by NSCC EPDXY MANUFACTURING CO., LTD.; an epoxy resin containing a naphthalene group including ESN-190 and ESN-360 manufactured by Nippon Steel Chemical Co., Ltd. and HP-4032, EXA-4750 and EXA-4700 manufactured by DIC Corporation; an epoxy resin having a dicyclopentadiene skeleton including HP-7200 and HP-7200H manufactured by DIC Corporation; a glycidylmethacrylate copolymerization-based epoxy resin including CP-50S and CP-50M manufactured by NOF CORPORATION; a copolymerization epoxy resin between cyclohexylmaleimide and glycidylmethacrylate; an epoxy modified polybutadiene rubber derivative including PB-3600 manufactured by DAICEL CHEMICAL INDUSTRIES, LTD., and CTBN modified epoxy resin including YR-102 and YR-450 manufactured by NSCC EPDXY MANUFACTURING CO., LTD.

The polyfunctional epoxy compound may be used either singly or in combination of two or more. Among them, a Novolac type epoxy resin, a heterocycle type epoxy resin, a bisphenol A type epoxy resin, and a mixture thereof are particularly preferable.

Specific examples of the polyfunctional oxetane compound include polyfunctional oxetanes like bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and an oligomer or copolymer thereof, and also etherfied product between oxetane alcohol and a Novolac resin or a resin having a hydroxy group like poly(p-hydroxystyrene), cardo type bisphenols, calixarenes, calixresorcinarenes, or silsesquioxane. In addition to them, a copolymer between an unsaturated monomer having an oxetane ring and alkyl(meth)acrylate is also included.

Specific examples of the episulfide resin include a bisphenol A type episulfide resin like YL7000 manufactured by Mitsubishi Chemical Corporation. Further, an episulfide resin in which the oxygen atom in the epoxy group of a Novolac type epoxy resin is replaced with a sulfur atom according to the same synthetic method can be also used.

The addition amount of the thermocurable resin having two or more cyclic (thio)ether groups in the molecule is preferably 0.6 to 2.5 eq. compared to 1 eq. of the carboxyl group in the resin containing a carboxyl group. When it is less than 0.6 eq., the carboxyl groups remain on a solder resist film to lower heat resistance, alkali resistance, and electrical insulating property. On the other hand, when it is more than 2.5 eq., a cyclic (thio)ether group with low molecular weight remains on a dried coating film to lower the strength of a coating film, etc. The addition amount is more preferably 0.8 to 2.0 eq.

Further, examples of the compound having two or more isocyanate groups or blocked isocyanate groups in the molecule include a compound having two or more isocyanate groups in the molecule, i.e., a polyisocyanate compound, and a compound having two or more blocked isocyanate groups in the molecule, i.e., a blocked isocyanate compound.

Examples of the polyisocyanate compound that can be used include an aromatic polyisocyanate, an aliphatic polyisocyanate, and an alicyclic polyisocyanate.

Specific examples of the aromatic polyisocyanate include 4,4'-diphenylmethanediisocyanate, 2,4-tolylenediisocyanate, 2,6-tolylenediisocyanate, naphthalene-1,5-diisocyanate, o-xylene diisocyanate, m-xylene diisocyanate, and a 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate), and isophorone diisocyanate.

Specific examples of the alicyclic polyisocyanate include bicycloheptane triisocyanate.

As a blocked isocyanate compound having two or more blocked isocyanate groups in the molecule, an addition reaction product between an isocyanate compound and an isocyanate blocking agent is used. The blocked isocyanate group contained in a blocked isocyanate compound is a temporarily inactivated group which is obtained by protection of an isocyanate group through a reaction with a blocking agent. When the blocked isocyanate group is heated to a pre-determined temperature, the blocking agent is dissociated to yield an isocyanate group.

Examples of the isocyanate compound which can react with a blocking agent for isocyanate include isocyanurate type, biurete type, and adduct type. Examples thereof that can be used include aromatic polyisocyanate, aliphatic polyisocyanate, and alicyclic polyisocyanate.

Specific examples of the aromatic polyisocyanate include 4,4'-diphenylmethanediisocyanate, 2,4-tolylenediisocyanate, 2,6-tolylenediisocyanate, naphthalene-1,5-diisocyanate, o-xylene diisocyanate, m-xylene diisocyanate, and a 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate), and isophorone diisocyanate.

Specific examples of the alicyclic polyisocyanate include bicycloheptane triisocyanate.

Specific examples of the isocyanate blocking agent include a phenol type blocking agent like phenol, cresol, xylenol, chlorophenol, and ethylphenol; a lactam type blocking agent like $\epsilon$-caprolactam, $\delta$-valerolactam, $\gamma$-butyrolactam, and $\beta$-propiolactam; an activated methylene type blocking agent like ethyl acetoacetate and acetyl acetone; an alcohol type blocking agent like methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; an oxime type blocking agent like formaldehyde oxime, acetaldoxime, acetoxime, methyl ethyl ketoxime, diacetyl monooxime, and cyclohexane oxime; a mercaptan type blocking agent like butylmercaptan, hexylmercaptan, t-butylmercaptan, thiophenol, methylthiophenol, and ethylthiophenol; an acid amide type blocking agent like acetic acid amide and benzamide; an imide type blocking agent like succinic acid imide and maleic acid imide; an amine type blocking agent like xylidine, aniline, butylamine, and dibutylamine; an imidazole type blocking agent like imidazole and 2-ethylimidazole, and; an imine type blocking agent like methyleneimine and propyleneimine.

The blocked isocyanate compound may be a commercially available product and examples thereof include SUMIDUR (registered trademark) BL-3175, BL-4165, BL-1100, BL-1265, DESMODUR (registered trademark) TPLS-2957, TPLS-2062, TPLS-2078, TPLS-2117, DESMOTHERM (registered trademark) 2170, DESMOTHERM2265, all manufactured by Sumitomo Bayer Urethane Co., Ltd., CORONATE (registered trademark) 2512, CORONATE 2513, and CORONATE 2520 all manufactured by Nippon Polyurethane Industry Co., Ltd., B-830, B-815, B-846, B-870, B-874, and B-882 all manufactured by Mitsui Takeda Chemicals Inc., and TPA-B80E, 17B-60PX and E402-B80T all manufactured by Asahi Kasei Chemicals Corporation. SUMIDUR BL-3175 and BL-4265 are obtained by using methylethyl oxime as a blocking agent.

A compound having two or more isocyanate groups or blocked isocyanate groups in the molecule may be used either singly or in combination of two or more.

The addition amount of the compound having two or more isocyanate groups or blocked isocyanate groups in the molecule is preferably 1 to 100 parts by mass compared to 100 parts by mass of the resin containing a carboxyl group. When it is less than 1 part by mass, sufficient toughness of a coating film is not obtained. On the other hand, when it is more than 100 parts by mass, storage stability is reduced. More preferably, the addition amount is 2 to 70 parts by mass.

Examples of the thermocurable resin include an amine resin like melamine resin and benzoguanamine resin, and derivatives thereof. Specific examples include a methylol melamine compound, a methylol benzoguanamine compound, a methylol glycol uryl compound, and a methylol urea compound.

Further, an alkoxymethylated melamine compound, an alkoxymethylated benzoguanamine compound, an alkoxymethylated glycol uryl compound, and an alkoxymethylated urea compound, that are obtained by converting the methylol group to an alkoxymethyl group, can be also used. Type of the alkoxymethyl group is not specifically limited. Examples thereof include a methoxymethyl group, an ethoxymethyl group, a propoxymethyl group, and a butoxymethyl group. Formalin with concentration of 0.2% or less, which is mild to be used for a human or an environment, is particularly preferable.

Specific examples of a commercially available product thereof include CYMEL (registered trademark) 300, CYMEL 301, CYMEL 303, CYMEL 370, CYMEL 325, CYMEL 327, CYMEL 701, CYMEL 266, CYMEL 267, CYMEL 238, CYMEL 1141, CYMEL 272, CYMEL 202, CYMEL 1156, CYMEL 1158, CYMEL 1123, CYMEL 1170, CYMEL 1174, CYMEL UFR65, and CYMEL UFR300 manufactured by Mitsui Cyanamid Co. Ltd., NIKALAC (registered trademark) Mx-750, NIKALAC Mx-032, NIKALAC Mx-270, NIKALAC Mx-280, NIKALAC Mx-290, NIKALAC Mx-706, NIKALAC Mx-708, NIKALAC Mx-40, NIKALAC Mx-31, NIKALAC Ms-11, NIKALAC Mw-30, NIKALAC Mw-30 HM, NIKALAC Mw-390, NIKALAC Mw-100 LM, and NIKALAC Mw-750 LM manufactured by Sanwa Chemical Co., Ltd.

The thermocurable resin may be used either singly or in combination of two or more.

The addition amount of the amine resin and derivatives thereof is preferably 1 to 100 parts by mass compared to 100 parts by mass of the resin containing a carboxyl group. When it is less than 1 part by mass, sufficient toughness of a coating film is not obtained. On the other hand, when it is more than 100 parts by mass, storage stability is reduced. More preferably, the addition amount is 2 to 70 parts by mass.

When a thermocurable resin having two or more cyclic (thio)ether groups in the molecule is used, a thermocuring catalyst is preferably contained. Specific examples of the thermocuring catalyst include imidazole derivatives like imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds like dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine, hydrazine compounds like adipic acid dihydrazide and sebacic acid dihydrazide, and; phosphorus compounds like triphenylphosphine.

Further, specific examples of a commercially available product thereof include, as an imidazole-based compound, 2MZ-A, 2MZ-OK, 2PHZ, 2P4BHZ, 2P4 MHZ manufactured by Shikoku Chemicals Corporation, U-CAT (registered trademark) 3503N, U-CAT3502T (trade names of block isocyanate of dimethylamine), DBU, DBN, U-CATSA102, and U-CAT5002 (bicyclic amidine compounds and salts thereof) manufactured by SAN-APRO LIMITED. However, it is not specifically limited thereto and a thermocuring catalyst consisting of an epoxy resin or an oxetane compound or a thermocuring catalyst which promotes a reaction between an epoxy group and/or an oxetanyl group and a carboxyl group can be used. It may be used either singly or in combination of two or more.

Further, guanamine, acetoguanamine, benzoguanamine, melamine, and S-triazine derivatives like 2,4-diamino-6-methacryloyloxyethyl-5-triazine, 2-vinyl-2,4-diamino-5-triazine, 2-vinyl-4,6-diamino-5-triazine.isocyanuric acid adduct, and 2,4-diamino-6-methacryloyloxyethyl-5-triazine.isocyanuric acid adduct, which also function as an agent for imparting adhesion, can be used. It is preferable that they are used in combination with a thermocuring catalyst.

The thermocuring catalyst used at common addition ratio is sufficient, and the addition amount thereof is preferably 0.1 to 20 parts by mass, and more preferably 0.5 to 15.0 parts by mass compared to 100 parts by mass of the resin containing a carboxyl group or the thermocurable resin having two or more cyclic (thio)ether groups, for example.

For the photocurable resin composition of the preferred embodiment of the invention, an adhesion promoter can be used to improve adhesion between layers or adhesion between a photosensitive resin layer and a substrate, and specific examples thereof include benzimidazole, benzoxazole, benzothiazole, 2-mercaptobenzimidazole, 2-mercaptobenzoxazole, 2-mercaptobenzothiazole, 3-morpholinomethyl-1-phenyl-triazole-2-thione, 5-amino-3-morpholinomethyl-thiazole-2-thione, 2-mercapto-5-methylthio-thiadiazole, triazole, tetrazole, benzotriazole, carboxybenzotriazole, benzotriazole containing an amino group, and a silane coupling agent.

Further, for the photocurable resin composition of the preferred embodiment of the invention, a binder polymer may be used for the purpose of improving touch dryness of fingers and handling property, or the like. Examples of the binder polymer include a polyester-based polymer, a polyurethane-based polymer, a polyester urethane-based polymer, a polyamide-based polymer, a polyester amide-based polymer, an acryl-based polymer, a cellulose-based polymer, a polylactic acid-based polymer, and a phenoxy-based polymer. The binder polymer may be used either singly or in combination of two or more.

Further, for the photocurable resin composition of the preferred embodiment of the invention, an elastomer may be used for the purpose of imparting flexibility and improving brittleness of a cured product. Examples of the elastomer include a polyester-based elastomer, a polyurethane-based elastomer, a polyester urethane-based elastomer, a polyamide-based elastomer, a polyester amide-based elastomer, an acryl-based elastomer, and an olefin-based elastomer. Further, an elastomer of an epoxy resin with various skeletons in which part or all of the epoxy groups are modified with both end carboxylic acid-modified butadiene-acrylonitrile rubber can be also used. Further, an epoxy-containing polybutadiene-based elastomer, an acryl-containing polybutadiene-based elastomer, a hydroxy-containing polybutadiene-based elastomer, a hydroxy-containing isoprene-based elastomer or the like can be also used. The elastomer may be used either singly or in combination of two or more.

The photocurable resin composition of the preferred embodiment of the invention may be added with a colorant. As a colorant, those having blue, green, yellow, or red color that are well known in the field can be used, and any one of a pigment, a dye, and a color may be used. However, from the viewpoint of reducing a burden to an environment and effects on human body, the colorant preferably does not contain a halogen. Specific examples include those given with the Color Index (C. I.; published by The Society of Dyers and Colourists) number as described below.

As a blue colorant, a phthalocyanine-based, an anthraquinone-based and the like are used. Examples of the pigment-based colorant include Pigment Blue 15, Pigment Blue 15:1, Pigment Blue 15:2, Pigment Blue 15:3, Pigment Blue 15:4, Pigment Blue 15:6, Pigment Blue 16, and Pigment Blue 60.

Examples of the dye-based colorant include Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67, and Solvent Blue 70. In addition to them, a metal substituted or unsubstituted phthalocyanine compound can be also used.

As a green colorant, a phthalocyanine-based, an anthraquinone-based, a perylene-based and the like are also used. Examples thereof include Pigment Green 7, Pigment Green 36, Solvent Green 3, Solvent Green 5, Solvent Green 20, and Solvent Green 28. In addition to them, a metal substituted or unsubstituted phthalocyanine compound can be also used.

As a yellow colorant, a monoazo-based, a disazo-based, a condensed azo-based, a benzimidazolone-based, an isoindolinone-based, an anthraquinone-based colorant or the like can be used. Specific examples are as described below.

monoazo-based: Pigment Yellow 1, 2, 3, 4, 5, 6, 9, 10, 12, 61, 62, 62:1, 65, 73, 74, 75, 97, 100, 104, 105, 111, 116, 167, 168, 169, 182, 183 disazo-based: Pigment Yellow 12, 13, 14, 16, 17, 55, 63, 81, 83, 87, 126, 127, 152, 170, 172, 174, 176, 188, 198 condensed azo-based: Pigment Yellow 93, Pigment Yellow 94, Pigment Yellow 95, Pigment Yellow 128, Pigment Yellow 155, Pigment Yellow 166, Pigment Yellow 180 benzimidazolone-based: Pigment Yellow 120, Pigment Yellow 151, Pigment Yellow 154, Pigment Yellow 156, Pigment Yellow 175, Pigment Yellow 18 isoindolinone-based: Pigment Yellow 110, Pigment Yellow 109, Pigment Yellow 139, Pigment Yellow 179, Pigment Yellow 185 anthraquinone-based: Solvent Yellow 163, Pigment Yellow 24, Pigment Yellow 108, Pigment Yellow 193, Pigment Yellow 147, Pigment Yellow 199, Pigment Yellow 202.

As a red colorant, a monoazo-based, a disazo-based, a monoazolake-based, a benzimidazolone-based, a perylene-based, a diketopyrrolopyrrole-based, a condensed azo-based, an anthraquinone-based, a quinacridone-based colorant or the like can be used. Specific examples are as described below.

monoazo-based: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, 269 disazo-based: Pigment Red 37, 38, 41 monoazolake-based: Pigment Red 48:1, 48:2, 48:3, 48:4, 49:1, 49:2, 50:1, 52:1, 52:2, 53:1, 53:2, 57:1, 58:4, 63:1, 63:2, 64:1, 68.

benzimidazolone-based: Pigment Red 171, Pigment Red 175, Pigment Red 176, Pigment Red 185, Pigment Red 208 perylene-based: Solvent Red 135, Solvent Red 179, Pigment Red 123, Pigment Red 149, Pigment Red 166, Pigment Red 178, Pigment Red 179, Pigment Red 190, Pigment Red 194, Pigment Red 224 diketopyrrolopyrrole-based: Pigment Red 254, Pigment Red 255, Pigment Red 264, Pigment Red 270, Pigment Red 272 condensed azo-based: Pigment Red 220, Pigment Red 144, Pigment Red 166, Pigment Red 214, Pigment Red 220, Pigment Red 221, Pigment Red 242 anthraquinone-based: Pigment Red 168, Pigment Red 177, Pigment Red 216, Solvent Red 149, Solvent Red 150, Solvent Red 52, Solvent Red 207 quinacridone-based: Pigment Red 122, Pigment Red 202, Pigment Red 206, Pigment Red 207, Pigment Red 209.

In addition to the above, a colorant having a violet color, an orange color, a brown color, or a black color or the like may be used under the purpose of controlling color tone.

Specifically, examples of the violet colorant include Pigment Violet 19, 23, 29, 32, 36, 38, 42, Solvent Violet 13, 36, examples of the orange colorant include Pigment Orange 5, Pigment Orange 13, Pigment Orange 14, Pigment Orange 16, Pigment Orange 17, Pigment Orange 24, Pigment Orange 34, Pigment Orange 36, Pigment Orange 38, Pigment Orange 40, Pigment Orange 43, Pigment Orange 46, Pigment Orange 49, Pigment Orange 51, Pigment Orange 61, Pigment Orange 63, Pigment Orange 64, Pigment Orange 71, Pigment Orange 73, examples of the brown colorant include Pigment Brown 23, Pigment Brown 25, and examples of the black colorant include Pigment Black 1, Pigment Black 7.

The addition ratio of the colorant is not specifically limited. However, to obtain desired coloration without affecting the characteristics, it is preferably 0 to 10 parts by mass compared to 100 parts by mass of the resin containing a carboxyl group. More preferably, it is 0.1 to 5 parts by mass.

To prevent oxidation, the photocurable resin composition of the preferred embodiment of the invention may be added with an anti-oxidant. Once oxidized, most polymer materials undergo oxidative deterioration in turn to cause a reduction in function of the polymer components. Thus, an anti-oxidant like a radical supplement to scavenge radicals generated or a peroxide dissociating agent which dissociates peroxides generated into a non-toxic substance to prevent further generation of radicals is effective.

Examples of the anti-oxidant which functions as a radical supplement include a phenol-based compound like hydroquinone, 4-tert-butylcatechol, 2-t-butylhydroquinone, hydroquinone monomethyl ether, 2,6-di-t-butyl-p-cresol, 2,2-methylene-bis-(4-methyl-6-t-butylphenol), 1,1,3-tris(2-methyl-4-hydroxy-5-t-butylphenyl)butane, 1,3,5-trimethyl-2,4,6-tris (3,5-di-t-butyl-4-hydroxybenzyl)benzene, and 1,3,5-tris(3', 5'-di-t-butyl-4-hydroxybenzyl)-S-triazine-2,4,6-(1H, 3H, 5H)trione, a quinone-based compound like metaquinone and benzoquinone, and an amine-based compound like bis(2,2,6, 6-tetramethyl-4-piperidyl)-sebacate and phenothiazine.

The radical supplement may be a commercially available product and examples thereof include ADEKASTAB (registered trademark) AO-30, ADEKASTAB AO-330, ADEKASTAB AO-20, ADEKASTAB LA-77, ADEKASTAB LA-57, ADEKASTAB LA-67, ADEKASTAB LA-68, ADEKASTAB LA-87, manufactured by ADEKA CORPORATION, and IRGANOX (registered trademark) 1010, IRGANOX1035, IRGANOX1076, IRGANOX1135, TINUVIN (registered trademark) 111 FDL, TINUVIN 123, TINUVIN 144, TINUVIN 152, TINUVIN 292, TINUVIN 5100 manufactured by BASF Japan.

Specific examples of the anti-oxidant functioning as a peroxide dissociating agent include a phosphorus-based compound like triphenyl phosphate, and a sulfur-based compound like pentaerythritol tetralauryl thiopropionate, dilauryl thiodipropionate, and distearyl 3,3'-thiodipropionate.

The peroxide dissociating agent may be a commercially available product and examples thereof include ADEKASTAB TPP manufactured by ADEKA CORPORATION, MARK AO-412S manufactured by Adeka Argus Chemical Co., Ltd., and SUMILIZER (registered trademark) TPS manufactured by Sumitomo Chemical Co. Ltd.

The anti-oxidant may be used either singly or in combination of two or more.

The photocurable resin composition of the preferred embodiment of the invention may be added with an UV absorbent. Since the polymer materials absorb light and undergo degradation.deterioration, a measure for stabilization against UV light is useful.

Examples of the UV absorbent include benzophenone derivatives, benzoate derivatives, benzotriazole derivatives, triazine derivatives, benzothiazole derivatives, cinnamate derivatives, anthranylate derivatives, dibenzoylmethane derivatives, and coumarin derivatives.

Specific examples of the benzophenone derivatives include 2-hydroxy-4-methoxy-benzophenone 2-hydroxy-4-methoxybenzophenone, 2-hydroxy-4-n-octoxybenzophenone, 2,2'-dihydroxy-4-methoxybenzophenone and 2,4-dihydroxybenzophenone.

Specific examples of the benzoate derivatives include 2-ethylhexylsalicylate, phenylsalicylate, p-tert-butylphenylsalicylate, 2,4-di-tert-butylphenyl-3,5-di-tert-butyl-4-hydroxybenzoate and hexadecyl-3,5-di-tert-butyl-4-hydroxybenzoate.

Specific examples of the benzotriazole derivatives include 2-(2'-hydroxy-5'-t-butylphenyl)benzotriazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-butylphenyl)-5-chloro benzotriazole, 2-(2'-hydroxy-5'-methylphenyl)benzotriazole and 2-(2'-hydroxy-3',5'-di-tert-amylphenyl)benzotriazole.

Specific examples of the triazine derivatives include hydroxyphenyltriazine and bisethylhexyloxyphenol methoxyphenyltriazine.

The UV absorbent may be a commercially available product and examples thereof include TINUVIN PS, TINUVIN 99-2, TINUVIN 109, TINUVIN 384-2, TINUVIN 900, TINUVIN 928, TINUVIN 1130, TINUVIN 400, TINUVIN 405, TINUVIN 460, TINUVIN 479, all manufactured by BASF Japan.

The UV absorbent may be used either singly or in combination of two or more. When used in combination of an anti-oxidant, a cured product obtained from the photocurable resin composition of the preferred embodiment of the invention can be stabilized.

The photocurable resin composition of the preferred embodiment of the invention may contain a filler, if necessary. An inorganic or organic filler that are well known in the field may be used as a filler.

To increase the physical strength or the like of a coating film, barium sulfate, spherical silica and talc are particularly preferably used.

Further, to obtain white appearance or inflammability, metal oxides like titan oxide and metal hydroxides like aluminum hydroxide may be used as a body pigment filler.

The addition amount of the filler is 75% by mass or less in the total mass of the composition. When it is more than 75% by mass in the total mass of the composition, viscosity of an insulating composition is high so that coatability or moldability is lowered or a soft cured product is obtained. More preferably, the addition amount is at the ratio of 0.1 to 60% by mass.

The photocurable resin composition of the preferred embodiment of the invention may contain a thixo agent like fine silica powder, organic bentonite, montmorilonite, and HYDROTALCITE, if necessary. In terms of stability over time as a thixo agent, organic bentonite and HYDROTALCITE are preferable. The HYDROTALCITE has an excellent electric property, in particular.

Further, additives that are well known in the field like a thermal polymerization inhibitor, a defoaming agent and/or a leveling agent such as silicone-based, fluorine-based, or polymer-based agent, a silane coupling agent such as imidazole-based, thiazole-based, or triazole-based coupling agent, and an anti-rust agent may be also added.

To synthesize the resin containing a carboxyl group or a composition or to control viscosity for coating on a board or a carrier film, the photocurable resin composition of the preferred embodiment of the invention may contain an organic solvent.

Examples of the organic solvent include ketones, aromatic hydrocarbons, glycol ethers, glycol ether acetates, esters, alcohols, aliphatic hydrocarbons, and petroleum-based solvents. Specific examples include ketones like methylethyl ketone and cyclohexanone; aromatic hydrocarbons like toluene, xylene, and tetramethylbenzene; glycol ethers like cellosolve, methyl cellosolve, butyl cellosolve, carbitol, methylcarbitol, butylcarbitol, propylene glycol monomethyl ether, dipropylene glycol monomethyl ether, dipropylene glycol diethyl ether, and triethylene glycol monoethyl ether; esters like ethyl acetate, butyl acetate, dipropylene glycol methyl ether acetate, propylene glycol methyl ether acetate, propylene glycol ethyl ether acetate, and propylene glycol butyl ether acetate; alcohols like ethanol, propanol, ethylene glycol, and propylene glycol; aliphatic hydrocarbons like octane and decane, and petroleum-based solvents like petroleum ether, petroleum naphtha, hydrogenated petroleum naphtha, and solvent naphtha. The organic solvent may be used either singly or in a combination of two or more.

The photocurable resin composition of the preferred embodiment of the invention may contain, if necessary, additives that are well known in the field like a thermal polymerization inhibitor, a thickening agent like fine silica powder, organic bentonite, and montmorilonite, a defoaming agent, a leveling agent such as silicone-based, fluorine-based, or polymer-based agent, a silane coupling agent such as imidazole-based, thiazole-based, or triazole-based coupling agent, and an anti-rust agent.

Among them, the thermal polymerization inhibitor may be used to prevent thermal polymerization or polymerization over time of a polymerizable compound. Specific examples the thermal polymerization inhibitor include 4-methoxyphenol, hydroquinone, alkyl or aryl-substituted hydroquinone, t-butylcatechol, pyrogallol, 2-hydroxybenzophenone, 4-methoxy-2-hydroxybenzophenone, copper (I) chloride, phenothiazine, chloranyl, naphthylamine, β-naphthol, 2,6-di-t-butyl-4-cresol, 2,2'-methylenebis(4-methyl-6-t-butylphenol), pyridine, nitrobenzene, dinitrobenzene, picric acid, 4-toluidine, methylene blue, a reaction product between copper and an organic chelating agent, methyl salicylate, and phenothiazine, a nitroso compound, and a chelate between a nitroso compound and Al.

The photocurable resin composition of the preferred embodiment of the invention is produced with a pre-determined addition ratio. For example, after being adjusted with an organic solvent to have viscosity suitable for coating method, the composition is coated on a substrate according to a method including dip coating, flow coating, roll coating, bar coating, screen printing, and curtain coating.

As a substrate, in addition to a printed wiring board in which circuits are already formed or a flexible printed wiring board, a copper clad laminate of all grades (FR-4 and the like) using a composite like paper-phenol resin, paper-epoxy resin, glass fabric-epoxy resin, glass-polyimide, glass fabric/nonwoven fabric-epoxy resin, glass fabric/paper-epoxy resin, synthetic fiber-epoxy resin, and fluoro resin.polyethylene.PPO.cyanate ester, a polyimide film, a PET film, a glass substrate, a ceramic substrate, and a wafer plate can be used.

According to volatilization and drying (pseudo-drying) of an organic solvent contained the composition at the temperature of about 60 to 100° C., a tack-free dried coating film is formed.

The volatilization drying can be performed by a method for countercurrent contact with hot air in a dryer using an apparatus equipped with a heat source for steam-based air heating system like hot air circulation drying furnace, an IR furnace, a hot plate, a convention oven, or by a method of spraying hot air from a nozzle to a substrate.

After that, according to direct exposure or divided projection exposure, active energy ray is selectively irradiated on a coating film to perform photocuring of an exposed section.

As an exposure device used for irradiation of active energy ray, a direct patterning device (for example, a laser direct imaging device for directly drawing an image with laser by following CAD data supplied from a computer) or a direct patterning device using UV lamp like a (ultra) high mercury lamp can be used. As a direct patterning device, a device manufactured by Orbotech Japan Co., Ltd. or a device manufactured by PENTAX, or the like can be used, for example. In addition to them, an exposure device having a metal halide lamp, an exposure device having a (ultra) high mercury lamp, or an exposure device having a mercury short arc lamp can be used.

The active energy is required to have peak wavelength in the range of 300 to 450 nm, wherein the photocurable resin composition of the preferred embodiment of the invention has sufficient light absorption. Further, when laser is used, a medium is not specifically limited whether it is gas laser or solid laser, as long as it can emit laser beam with the wavelength in the range.

Although it may vary depending on film thickness or the like, the exposure amount is generally within the range of 5 to 200 mJ/cm$^2$. Further, since high sensitivity can be obtained for the photocurable resin composition of the preferred embodiment of the invention, it may be preferably within the range of 5 to 100 mJ/cm$^2$, and more preferably 5 to 50 mJ/cm$^2$.

Thereafter, by developing an unexposed section using a dilute aqueous solution of alkali, a resist pattern is formed. Examples of a development method that can be used include a dipping method, a shower method, a spray method, and a brush method. Examples of a development liquid that can be used include dilute aqueous solution of alkali like potassium hydroxide, sodium hydroxide, sodium carbonate, potassium carbonate, sodium phosphate, sodium silicate, ammonia, and amines. Specifically, 0.3 to 3% by weight aqueous solution of sodium carbonate can be used, for example.

Further, it is preferable to perform thermal curing by heating to the temperature of about 140 to 180° C., for example. According to thermal curing, the carboxyl group in the resin containing a carboxyl group and a thermocurable component like a thermocurable resin having two or more cyclic ether groups and/or cyclic thio ether groups in the molecule are reacted with each other, and as a result heat resistance, chemical resistance, moisture resistance, adhesiveness, and electrical characteristics, or the like can be improved.

It is also possible that, instead of being directly coated on a substrate as described above, the photocurable resin composition of the preferred embodiment of the invention is coated in advance on a film and dried, and the resulting dried coating film is wound as a film and then adhered as a dried film on a substrate.

The dried film has a structure in which a carrier film, a solder resist layer (photocurable resin composition layer), and if necessary, a releasable cover film, are laminated in the order, for example. After forming a solder resist layer on a carrier film, a cover film is laminated thereon, if necessary, or a solder resist layer is formed on a cover film and the resulting laminate is laminated on the carrier film to produce a dried film.

As a carrier film, a thermoplastic film like polyethylene terephthalate film and polyester film with thickness of 2 to 150 μm is used.

The solder resist layer is formed by evenly coating the photocurable resin composition to thickness of 10 to 150 μm on a carrier film or a cover film using a blade coater, a lip coater, a comma coater, a film coater or the like followed by drying.

As a cover film, a polyethylene film and a polypropylene film or the like can be used. A film having smaller adhesiveness to a solder resist layer than a carrier film is preferable.

By using a dried film, a protective film (a permanent protective film) may be formed as follows on a printed wiring board, for example. First, a cover film is removed, if necessary, and a solder resist layer is overlaid on a printed board and they are fixed to each other by using a laminator, etc. so that a solder resist layer is formed on a printed wiring board. In addition, by performing light exposure, development, and heat curing of the solder resist layer, a protective film (a permanent protective film) is formed. In addition, the carrier film may be released either before or after the exposure.

Herein below, the embodiments of the invention are explained specifically in view of the examples and comparative examples. However, it is evident that the invention is not limited by the examples. Further, the terms "part" and "%" as used herein under are all based on mass, unless specifically described otherwise.

Synthetic Example 1

In a flask equipped with a thermometer, a stirrer, a dropping funnel, and a reflux condenser, 325.0 parts of dipropylene glycol monomethyl ether as a solvent was heated to 110° C. and a mixture containing 174.0 parts of methacrylic acid, 174.0 parts of ε-caprolactone-modified methacrylic acid (average molecular weight of 314), 77.0 parts of methyl methacrylate, 222.0 parts of dipropylene glycol monomethyl ether, and 12.0 parts of t-butyl peroxy 2-ethylhexanoate (PERBUTYL (registered trademark) O, manufactured by NOF CORPORATION) as a polymerization catalyst was added dropwise thereto over three hours. The mixture was stirred for three hours at 110° C. and the polymerization catalyst was inactivated to obtain a resin solution.

The resin solution was cooled, and added with 289.0 parts of CYCLOMER A200 (trade name, manufactured by DAICEL CHEMICAL INDUSTRIES, LTD.), 3.0 parts of triphenylphosphine, and 1.3 parts of hydroquinone monomethyl ether. By increasing the temperature to 100° C. and stirring, a ring-opening addition reaction of the epoxy group was performed to obtain the solution (B-1) of the photosensitive resin containing a carboxyl group.

The resin solution (B-1) obtained from the above has weight average molecular weight (Mw) of 15,000, solid content of 57%, and solid matter acid value of 79.8 mgKOH/g.

Further, the weight average molecular weight of the resin obtained was measured by high performance liquid chromatography using LC-6AD pump manufactured by Shimadzu Corporation and three columns manufactured by Showa Denko K.K. (Shodex (registered trademark) KF-804, KF-803, KF-802), that are connected to each other.

Synthetic Example 2

To a three-neck flask equipped with a thermometer, a stirrer, a dropping funnel, and a reflux condenser, 200 parts of methyl methacrylate, 142 parts of glycidyl methacrylate, and 300 parts of diethylene glycol monoethyl ether acetate were added. After further adding azobisisobutyronitrile as a catalyst, the mixture was reacted at 80° C. for 10 hours under stirring.

Thereafter, 88 parts of methacrylic acid, 2.0 parts of triphenylphosphine, and 0.2 parts of hydroquinone as a stabilizer were measured and added dropwise to the mixture by using a dropping funnel, and reacted at 80° C. for 16 hours. 140 parts of tetrahydrophthalic anhydride was also added and reacted at 80° C. for 5 hours to obtain the solution (B-2) of the photosensitive resin containing a carboxyl group.

The resin solution (B-2) obtained from the above has solid content of 65%, and solid matter acid value of 91 mgKOH/g.

Synthetic Example 3

To a 5 liter separable flask equipped with a thermometer, a stirrer, and a reflux condenser, 1,245 g of polycaprolactone diol (trade name: PLACCEL208, manufactured by DAICEL CHEMICAL INDUSTRIES, LTD., molecular weight of 830) as a polymer polyol, 201 g of dimethylol propionic acid as a dihydroxy compound having a carboxyl group, 777 g of isophorone diisocyanate as polyisocyanate, 119 g of 2-hydroxyethylacrylate as (meth)acrylate having a hydroxy group, and p-methoxyphenol and di-t-butyl-hydroxytoluene, each in 0.5 g, were added.

The mixture was heated to 60° C. under stirring. After terminating the heating, 0.8 g of dibutyl tin dilaurate was added. Once the temperature inside the reaction vessel starts to decrease, the mixture was heated again and stirred continuously at 80° C. After confirming the disappearance of absorption spectrum (2280 cm$^{-1}$) of the isocyanate group in IR absorption spectrum, the reaction was completed to obtain a urethane acrylate compound as a viscous liquid. By using carbitolacetate, the non-volatile component was adjusted to 50% by mass to obtain the solution (B-3) of the photosensitive resin containing a carboxyl group.

The resin solution (B-3) obtained from the above has solid content of 50%, and solid matter acid value of 47 mgKOH/g.

Synthetic Example 4

To 600 g of diethylene glycol monoethyl ether acetate, 1070 g of ortho-cresol Novolac type epoxy resin [trade name: EPICLON N-695, manufactured by DIC Corporation, softening point of 95° C., epoxy eq. of 214, and average number of functional groups of 7.6] (number of glycidyl group (total number of aromatic rings): 5.0 mol), 360 g (5.0 mol) of acrylic acid, and 1.5 g of hydroquinone were added and heated at 100° C. under stirring to dissolve them homogeneously.

Subsequently, 4.3 g of triphenylphosphine was added to the solution and reacted for 2 hours by heating at 110° C. After increasing the temperature to 120° C., the reaction was further carried out for 12 hours. To the resulting reaction solution, 415 g of an aromatic-based hydrocarbon (SOLVESSO 150) and 456.0 g (3.0 mol) of tetrahydrophthalic anhydride were added. The reaction was performed at 110° C. for four hours. After cooling, the solution (B-4) of the photosensitive resin containing a carboxyl group was obtained.

The resin solution (B-4) obtained from the above has solid content of 65%, and solid matter acid value of 89 mgKOH/g.

Synthetic Example 5

To 700 g of diethylene glycol monoethyl ether acetate, 1070 g of ortho-cresol Novolac type epoxy resin [trade name: EPICLON N-695, manufactured by DIC Corporation, softening point of 95° C., epoxy eq. of 214, and average number of functional groups of 7.6] (number of glycidyl group (total number of aromatic rings): 5.0 mol), 360 g (5.0 mol) of acrylic acid, and 1.5 g of hydroquinone were added and heated to 100° C. under stirring to dissolve them homogeneously.

Subsequently, 4.3 g of triphenylphosphine was added to the solution and reacted for 2 hours by heating to 110° C. After that, 1.6 g of triphenylphosphine was further added and, after increasing the temperature to 120° C., the reaction was further carried out for 12 hours. To the resulting reaction solution, 562 g of an aromatic-based hydrocarbon (SOLVESSO 150, manufactured by Exxon Chemical Co. Ltd.) and 684 g (4.5 mol) of tetrahydrophthalic anhydride were added. The reaction was performed at 110° C. for four hours. To the resulting solution, 142.0 g (1.0 mol) of glycidyl methacrylate was added and the reaction was carried out for four hours at 115° C. to obtain the solution (B-5) of the photosensitive resin containing a carboxyl group.

The resin solution (B-5) obtained from the above has solid content of 65%, and solid matter acid value of 87 mgKOH/g.

Synthetic Example 6

400 parts of bisphenol F type solid epoxy resin having epoxy eq. of 800 and softening point of 79° C. was dissolved in 925 parts of epichlorohydrin and 462.5 parts of dimethyl sulfoxide. Then, 81.2 parts of 98.5% NaOH was added thereto over 100 min at 70° C. under stirring. After the completion of the addition, the reaction was further allowed to occur at 70° C. for 3 hours.

Subsequently, unreacted excess epichlorohydrin and most of dimethyl sulfoxide were distilled off under reduced pressure. The reaction product containing the salt of a side product and dimethyl sulfoxide was dissolved in 750 parts of methyl isobutyl ketone. By adding 10 parts of 30% NaOH, the reaction was carried out at 70° C. for 1 hour. After the completion of the reaction, it was washed twice with 200 parts of water. After separating the oil from the water, methyl isobutyl ketone was recovered by distillation from the oil layer to obtain 370 parts of the epoxy resin (a-1) having epoxy eq. of 290 and softening point of 62° C.

2900 parts (10 eq.) of the epoxy resin (a-1) obtained, 720 parts (10 eq.) of acrylic acid, 2.8 parts of methyl hydroquinone, and 1950 parts of carbitol acetate were combined and heated to 90° C. under stirring to dissolve the reaction mixture. Subsequently, the reaction solution was cooled to 60° C., added with 16.7 parts of triphenylphosphine, heated to 100° C., and reacted for about 32 hours to obtain the reaction product with acid value of 1.0 mgKOH/g. Next, 786 parts (7.86 mol) of succinic anhydride and 423 parts of carbitol acetate were added, heated to 95° C., and reacted for about 6 hours to obtain the solution (B-6) of the photosensitive resin containing a carboxyl group.

The resin solution (B-6) obtained from the above has solid content of 65%, and solid matter acid value of 100 mgKOH/g.

Synthetic Example 7

To an autoclave equipped with a thermometer, a device for introducing nitrogen gas and alkylene oxide, and a stirrer, 119.4 g of Novolac type cresol resin (trade name: Shonol C RG951, manufactured by SHOWA HIGHPOLYMER CO., LTD., OH eq.: 119.4), 1.19 g of potassium hydroxide, and 119.4 g of toluene were added and the temperature was increased by heating under stirring while purging the system with nitrogen gas.

Next, 63.8 g of propylene oxide was slowly added dropwise thereto and reacted for 16 hours at 125 to 132° C., 0 to 4.8 kg/cm$^2$. After cooling to room temperature, 1.56 g of 89% phosphoric acid was added to the reaction solution to neutralize potassium hydroxide. As a result, a solution of reaction product between polpylene oxide and Novolac type cresol resin with 62.1% non-volatile components and hydroxy value of 182.2 g/eq was obtained, wherein average 1.08 mol of alkylene oxide is added per 1 eq. of a phenolic hydroxy group.

293.0 g of alkylene oxide reaction solution of Novolac type cresol resin obtained, 43.2 g of acrylic acid, 11.53 g of methanesulfonic acid, 0.18 g of methyl hydroquinone, and 252.9 g of toluene were added to a reactor equipped with a stirrer, a thermometer, and an air injection tube. The reaction was allowed to progress for 12 hours at 110° C. under stirring while adding an air at the rate of 10 mL/min. The water generated according to the reaction is an azeotropic mixture with toluene, and 12.6 g of water was eluted.

After cooling to room temperature, the reaction solution obtained was neutralized with 35.35 g with 15% aqueous solution of sodium hydroxide followed by washing with water. After that, toluene was distilled off by replacement with 118.1 g of diethylene glycol monoethyl ether acetate in an evaporator. As a result, a solution of Novolac type acrylate resin was obtained.

After that, 332.5 g of the solution of Novolac type acrylate resin and 1.22 g of triphenylphosphine were added to a reactor equipped with a stirrer, a thermometer, and an air injection tube. 60.8 g of tetrahydrophthalic anhydride was slowly added thereto while adding an air at the rate of 10 mL/min. The reaction was allowed to progress for 6 hours at 95 to 101° C. to obtain the solution (B-7) of the photosensitive resin containing a carboxyl group.

The resin solution (B-7) obtained from the above has solid content of 71%, and solid matter acid value of 88 mgKOH/g.

Further, as the resin solution B-8, ZCR-1601H (trade name, manufactured by Nippon Kayaku Co., Ltd., acid value: 96 mgKOH/g, solid content: 65%), which is a commercially available product, was used as it is.

The resin solution B-1 to B-8 was mixed with the addition composition (based on parts by mass) described in the Table 1. After pre-mixing in a stirrer, it was kneaded with three roll mills to produce the photocurable resin composition for solder resist of the Examples 1 to 8 and the Comparative Examples 1 and 2.

Dispersion degree of the photocurable resin composition obtained above was evaluated by particle size measurement using Grind Meter manufactured by ERICHSEN GMBH & CO. KG. As a result, each was found to be 15 µm or less.

TABLE 1

|  |  | Example |  |  |  |  |  |  |  | Comparative Example |  |
|---|---|---|---|---|---|---|---|---|---|---|---|
|  |  | 1 | 2 | 3 | 4 | 5 | 6 | 7 | 8 | 1 | 2 |
| Photo polymerization initiator | A-1*1 | 1 | 0.8 | 1 | 1 | 1 | 1.2 | 1 | 1 |  |  |
|  | A-2*2 |  |  |  |  |  |  |  |  | 2 |  |
|  | A-1*3 |  |  | 3 |  |  |  |  |  | 3 | 15 |
|  | A-2*4 |  |  |  |  |  |  |  |  |  | 1 |
| Photosensitive resin solution | B-1 | 88 |  |  |  |  |  |  |  |  |  |
|  | B-2 |  | 77 |  |  |  |  |  |  |  |  |
|  | B-3 |  |  | 100 |  |  |  |  |  |  |  |
|  | B-4 |  |  |  |  | 154 |  |  |  | 154 | 154 |
|  | B-5 | 77 | 77 |  | 154 |  | 77 | 77 |  |  |  |
|  | B-6 |  |  |  |  |  | 77 |  |  |  |  |
|  | B-7 |  |  |  |  |  |  | 70 | 70 |  |  |
|  | B-8 |  |  |  | 77 |  |  |  |  |  |  |

*1: A-1
[Chemical Formula 3]

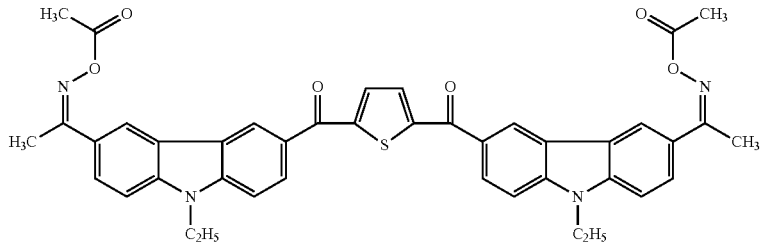 [SMILES: CCn1c2ccc(C(=O)c3ccc(C(=O)c4ccc5c(c4)c4cc(/C(C)=N\OC(C)=O)ccc4n5CC)s3)cc2c2cc(/C(C)=N\OC(C)=O)ccc21]

*2: A-2
[Chemical Formula 4]

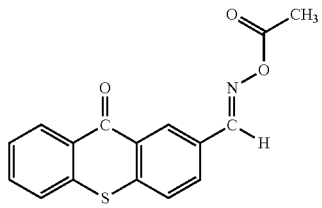 [SMILES: CC(=O)O/N=C/c1ccc2sc3ccccc3c(=O)c2c1]

(CGI-325 manufactured by BASF, Japan)
*3: A-3
2-methyl-1-(4-methylthiophenyl)-2-morpholinopropan-1-one
*4: A-4
2,4-diethylthioxanthone Common Components:
Compound containing an ethylenically unsaturated group: dipentaerythritol hexaacrylate (DPHA manufactured by Nippon Kayaku Co., Ltd.) 20 parts
Thermocurable resin: phenol Novolac type epoxy resin 15 parts
Pigment: C. I. Pigment Blue 15:3 0.3 parts
C. I. Pigment yellow 147 0.8 parts
Thermocuring catalyst: melamine 5 parts
Chain transfer agent/agent for imparting adhesiveness: mercaptobenzothiazole 0.5 parts
Agent for imparting thixo property: HYDROTALCITE (manufactured by Kyowa Chemical Industry Co., Ltd.) 6 parts
Silicone-based defoaming agent 3 parts
Organic solvent: DPM (dipropylene glycol monomethyl ether) 5 parts
Filler: barium sulfate (Barium sulfate B30 manufactured by Sakai Chemical Industry Co., Ltd.) 100 parts

[Performance Evaluation]

<Optimum Exposure Amount>

A circuit pattern board with copper thickness of 35 μm was subjected to buff roll polishing, washed with water, and dried. The photocurable resin composition of the Example and the Comparative Example was coated on the entire surface of the board by screen printing, and then the board was dried for 60 min in a hot air circulation drying furnace at 80° C.

The board was then subjected to light exposure by using an exposure device having a high pressure mercury lamp (manufactured by ORC MANUFACTURING CO., LTD., an exposure device having a mercury short arc lamp), a high pressure mercury lamp direct exposure device (Marculex (registered trademark) manufactured by Dainippon Screen Co., Ltd., a direct exposure device having a ultra-high pressure mercury lamp), or a direct imaging device (405 nm laser exposure device, manufactured by Hitachi Via Mechanics, Ltd.), each through a step tablet (Kodak No 2). Further, the board was developed for 60 sec under the following condition; temperature: 30° C., spray pressure: 0.2 MPa, development liquid: 1% by mass aqueous solution of sodium carbonate. When the pattern of the remaining step tablet is step 7, it is taken as optimum exposure amount.

<Maximum Development Life>

The photocurable resin composition of the Example and Comparative Example was coated on entire surface of a pattern-formed copper foil board by screen printing and dried at 80° C. From the minute 20 to minute 80, the board was removed every ten minutes and air-cooled to room temperature.

The board was developed for 60 sec under the following condition; temperature: 30° C., spray pressure: 0.2 MPa, development liquid: 1% by mass aqueous solution of sodium carbonate. The maximum allowable drying time which gives no residues was taken as maximum development life.

[Characteristics Evaluation]

The photocurable resin composition of the Example and Comparative Example was coated on entire surface of a pattern-formed copper foil board by screen printing and air-cooled to room temperature. By using an exposure device having a mercury short arc lamp, a solder resist pattern was formed on the board with the optimum exposure amount.

The board was developed for 60 sec under the following condition to obtain a resist pattern; temperature: 30° C., spray pressure: 0.2 MPa, development liquid: 1% by mass aqueous solution of sodium carbonate. In addition, the board was irradiated with UV light in an UV conveyer furnace with accumulated exposure amount of 1000 mJ/cm$^2$ followed by heating for 60 min at 150° C. for curing.

Characteristics of the printed board obtained (board for evaluation) were evaluated as follows.

<Solder Heat Resistance>

A board for evaluation coated with rosin-based flux was impregnated in a solder bath which has been already set at 260° C. After washing the flux with modified alcohol, naked eye evaluation was made with regard to expansion and peeling of the resist layer. Evaluation criteria are as follows.

○: No peeling was observed even after repeating three or more times the 10-sec impregnation.

Δ: Slight peeling was observed after repeating three or more times the 10-sec impregnation.

x: Resist layer was expanded and peeled before repeating three times the 10-sec impregnation.

<Resistance of Non-Electrolysis Gold Plating>

By using a commercially available non-electrolysis nickel plating bath and non-electrolysis gold plating bath, plating was carried out with a condition including 0.5 μm nickel and 0.03 μm gold. After evaluating any penetration of the plating, the presence or absence of peeling of the resist layer was evaluated according to tape peeling. Evaluation criteria are as follows.

◉: No penetration or peeling was observed.

○: Slight penetration was confirmed after plating, but there was no peeling after tape peeling.

Δ: Very minor penetration was observed after plating, and there was peeling after tape peeling.

x: There was peeling after plating.

<Electrical Insulating Properties>

IPCB-25 comb-shaped electrode B coupon on a copper foil film was used. Bias voltage of DC 100 V was applied to the comb-shaped electrode. After keeping in an incubator at 85° C., 85% R. H. for 1,000 hours, the presence or absence of migration was determined. Evaluation criteria are as follows.

◉: No change was observed at all.

○: Very minor change was observed.

Δ: Discoloration was observed.

x: Occurrence of migration was observed.

The evaluation results are given in the Table 2.

TABLE 2

|  | Example | | | | | | | | Comparative Example | |
| --- | --- | --- | --- | --- | --- | --- | --- | --- | --- | --- |
|  | 1 | 2 | 3 | 4 | 5 | 6 | 7 | 8 | 1 | 2 |
| High pressure mercury lamp exposure sensitivity (mJ/cm$^2$) | 10 | 15 | 50 | 20 | 40 | 30 | 25 | 20 | 80 | 400 |
| High pressure mercury lamp direct exposure sensitivity (mJ/cm$^2$) | 15 | 20 | 60 | 25 | 40 | 30 | 25 | 20 | 80 | 400 |
| 405 nm laser exposure sensitivity (mJ/cm2) | 20 | 25 | 60 | 25 | 50 | 40 | 30 | 30 | 100 | >600 |
| Maximun development life (min) | 70 | 70 | 60 | 60 | 60 | 70 | 70 | 70 | 60 | 70 |
| Solder heat resistance | ◉ | ◉ | ○ | ◉ | ◉ | ◉ | ◉ | ◉ | ◉ | ◉ |
| Resistance of non-electrolysis plating | ○ | ○ | ○ | ◉ | ◉ | ◉ | ◉ | ○ | ○ | ○ |
| Electrical insulating properties | ○ | ○ | ◉ | ◉ | ○ | ○ | ◉ | ◉ | ○ | ○ |

[Evaluation of Dried Film]

The photocurable resin composition of the Examples 1 and 2 and Comparative Examples 1 and 2 was diluted with methyl ethyl ketone, coated on a PET film, and dried at 80° C. for 30 min to form a resin composition layer with thickness of 20 μm. A cover film is applied thereon to produce a dried film, and each was taken as the Example 9 and 10 and Comparative Example 3 and 4. After peeling off the cover film, the film was heat-laminated on a pattern-formed copper foil board. As a result, the resin composition layer was closely adhered on the copper foil board.

The board obtained was coated with the photocurable resin composition and also subjected to light exposure. For the light exposure, an exposure device having a high pressure mercury lamp (manufactured by ORC MANUFACTURING CO., LTD., an exposure device having a mercury short arc lamp), or a direct imaging device (Paragon8000 manufactured by Orbotech Japan Co., Ltd., 355 nm laser exposure device) was used.

After peeling off the carrier film, the board was developed for 60 sec under the following condition to obtain a resist pattern; temperature: 30° C., spray pressure: 0.2 MPa, development liquid: 1% by mass aqueous solution of sodium carbonate. In addition, the board was subjected to thermal curing for 60 min using a hot air dryer at 150° C. and irradiated with UV light similar to above to produce a test board for evaluation of dried film.

Test for evaluating each characteristic was carried out for the test board obtained.

The evaluation results are given in the Table 3.

TABLE 3

|  | Example | | Comparative Example | |
|---|---|---|---|---|
|  | 9 | 10 | 3 | 4 |
| High pressure mercury lamp exposure sensitivity (mJ/cm²) | 10 | 15 | 40 | 400 |

TABLE 3-continued

|  | Example | | Comparative Example | |
|---|---|---|---|---|
|  | 9 | 10 | 3 | 4 |
| 355 nm laser exposure sensitivity (mJ/cm²) | 10 | 15 | 60 | 500 |
| Maximun development life (min) | 60 | 60 | 60 | 60 |
| Solder heat resistance | ○ | ○ | ○ | ○ |
| Resistance of non-electrolysis plating | ○ | ○ | ○ | Δ |
| Electrical insulating properties | ○ | ○ | ○ | Δ |

As described above, it was found that, by using the photocurable resin composition of the embodiment of the invention and dried film thereof, highly sensitive and short exposure can be achieved and also reliable properties including good solder heat resistance, non-electrolysis plating resistance, and electrical insulating properties can be obtained without compromising developability. Further, by using the photocurable resin composition, it becomes also possible to obtain high productivity when an exposure device having high alignment accuracy like direct exposure is used.

[Evaluation of Out Gas Amount]

The resin solution B-1 was mixed with addition composition (parts by mass) shown in the Table 4. The photocurable resin composition for solder resist of the Examples 11 and 12 and the Comparative Examples 5 and 6 were produced similar to above. A-1 corresponds to the photopolymerization initiator used in the Examples 1 to 8.

TABLE 4

|  |  | Example | | Comparative Example | |
|---|---|---|---|---|---|
|  |  | 11 | 12 | 5 | 6 |
| Photo polymerization initiator | A-1 | 0.5 | | | |
|  | A-5*5 | | 1 | | |
|  | A-6*6 | | | 2 | |
|  | A-7*7 | | | | 15 |
| Photosensitive resin solution | B-1 | 175 | 175 | 175 | 175 |
| TMPTA*8 |  | 10 | 10 | 10 | 10 |
| jER 1001*9 |  | 20 | 20 | 20 | 20 |
| Phenothiazine*10 |  | 0.1 | | 0.1 | |

*5: A-5
[Chemical Formula 5]

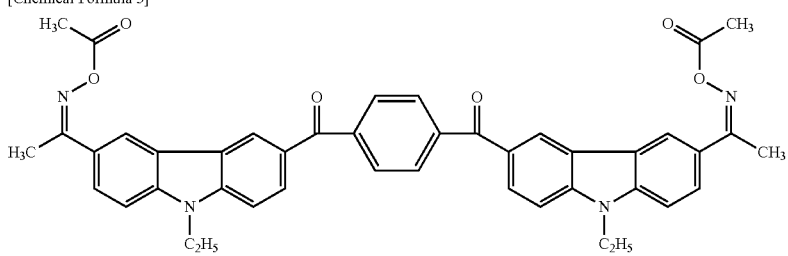

TABLE 4-continued

| | Example | | Comparative Example | |
|---|---|---|---|---|
| | 11 | 12 | 5 | 6 |

*6: A-6
[Chemical Formula 6]

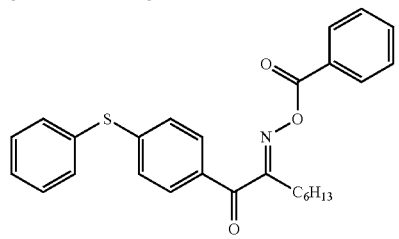

1,2-octanedione-1-[4-(phenylthio)phenyl]-2-(O-benzoyloxime) (trade name: IRG-OXE01, manufactured by BASF, Japan)
*7: A-7 (trade name: Irg907, manufactured by BASF, Japan)
*8: trimethylol propane triacrylate
*9: bisphenol A diglycidyl ether (manufactured by Mitsubishi Chemical Corporation)
*10: phenothiazine, polymerization inhibitor The photocurable resin composition was coated on a glass board by screen printing and dried for 30 min in a hot air circulation drying furnace at 80° C. After that, it was exposed with the optimum exposure amount by using a high pressure mercury lamp exposure device manufactured by ORC MANUFACTURING CO., LTD.

Subsequently, part of the coating film was scraped off as it is to give a sample before thermal curing. The remaining film was cured for 60 min at 150° C. and then the coating film was scraped off to give a sample after thermal curing.

1 mg of each sample was heated by purge and trap for 5 min at 150° C. and 30 min at 150° C. for the sample before thermal curing, or for 5 min at 245° C. for the sample after thermal curing. Components of the photopolymerization initiator generated were quantified by gas chromatography.

The optimum exposure amount and quantification results of the volatile components (i.e., out gas) derived from the photopolymerization initiator were given in the Table 5.

TABLE 5

| | | Example | | Comparative Example | |
|---|---|---|---|---|---|
| | | 11 | 12 | 5 | 6 |
| Optimum exposure amount (mJ/cm2) | | 10 | 30 | 80 | 300 |
| Sample out gas amount before thermocuring (%) | Heated at 150° C. for 5 min | Less than detection limit *11 | Less than detection limit *11 | 0.7 | 4.2 |
| | Heated at 150° C. for 30 min | 0.1 | 1.4 | 4.8 | 17.6 |
| Sample out gas amount after thermocuring (%) | Heated at 245° C. for 5 min | 0.4 | 1.7 | 3.2 | 19.0 |

*11 less than 0.1%

As shown in the above, it was found that the photocurable resin composition of the embodiment of the invention has high sensitivity and suppressed amount of volatile components (i.e., out gas) derived from the photopolymerization initiator for both cases of the sample before thermal curing and the sample after thermal curing. Thus, it is possible to inhibit contamination at the time of exposure by direct exposure or the like or mounting by reflow during a following process.

What is claimed is:
1. A photocurable resin composition, comprising:
a photopolymerization initiator comprising two oxime ester groups;
a resin comprising a carboxyl group;
a compound comprising two or more ethylenically unsaturated groups; and
a thermocurable resin,
wherein the photopolymerization initiator is an oxime ester compound represented by formula (1),

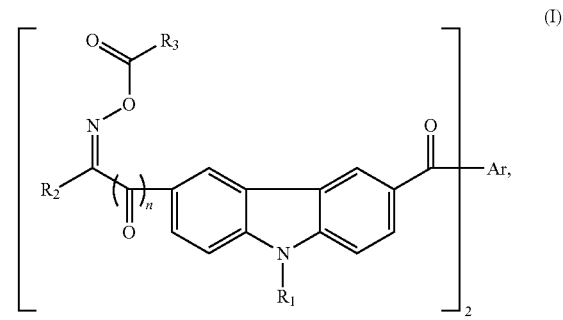

where $R_1$ represents a hydrogen atom, an alkyl group having 1 to 17 carbon atoms, an alkoxy group having 1 to 8 carbon atoms, a phenyl group, a phenyl group substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms, or a naphthyl group substituted with an alkyl group having 1 to 17 carbon atoms, an alkoxy group having 1 to 8 carbon atoms, an amino group, an alkylamino group or a dialkyl amino group with an alkyl group having 1 to 8 carbon atoms; $R_2$ and $R_3$ each represent a hydrogen atom, an alkyl group having 1 to 17 carbon atoms, an alkoxy group having 1 to 8 carbon atoms, a halogen group, a phenyl group, a phenyl group substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms, a naphthyl group substituted with an alkyl group having 1 to 17 carbon atoms, an alkoxy group having 1 to 8 carbon atoms, an amino group, or an alkylamino group or a dialkyl amino group with an alkyl group having 1 to 8 carbon atoms, an anthryl group, a pyridyl group, a benzofuryl group, or a benzothienyl group; Ar is a bond or represents alkylene having 1 to 10 carbon atoms, vinylene, phenylene, biphenylene, pyridylene, naphthylene, anthrylene, thienylene, furylene, 2,5-pyrrole-diyl, 4,4'-stilbene-diyl, or 4,2'-styrene-diyl; and n represents an integer of 0 to 1.

2. A dried film obtained by coating the photocurable resin composition of claim 1 on a film and then drying.

3. A cured product obtained by photocuring a dried coating film or a coating film with irradiation of an active energy ray, wherein the dried coating film is obtained by coating the photocurable resin composition of claim 1 on a substrate and then drying, and the coating film is obtained by laminating on a substrate a dried film obtained by coating the photocurable resin composition on a film and then drying.

4. A printed wiring board having a pattern of a cured product obtained by photocuring a dried coating film or a coating film with irradiation of active energy ray, wherein the dried coating film is obtained by coating the photocurable resin composition of claim 1 on a substrate and then drying, and the coating film is obtained by laminating on a substrate a dried film obtained by coating the photocurable resin composition on a film and then drying.

5. The photocurable resin composition according to claim 1, wherein an amount of the photopolymerization initiator having two oxime ester groups in a molecule is 0.01~5 parts by weight compared to 100 parts by weight of the resin comprising a carboxyl group.

6. The photocurable resin composition according to claim 1, wherein an amount of the resin comprising a carboxyl group is 20 to 80% by mass in a photocurable resin composition.

7. The photocurable resin composition according to claim 1, wherein the resin comprising a carboxyl group includes one of an urethane resin comprising a carboxyl group, a photosensitive resin comprising a carboxyl group obtained by adding a cyclic ether or cyclic carbonate to a polyfunctional phenol compound, partially esterifying the hydroxy group obtained with (meth) acrylic acid, and reacting the remaining hydroxy groups with a polybasic acid anhydride, and a photosensitive resin comprising a carboxyl group obtained by adding a compound having one epoxy group and at least one (meth) acryloyl group in a molecule to the resins of the urethane resin comprising a carboxyl group or the photosensitive resin comprising a carboxyl group.

8. The photocurable resin composition according to claim 1, wherein the compound having two or more ethylenically unsaturated groups in a molecule is 5 to 100 parts by mass compared to 100 parts by mass of the resin comprising a carboxyl group.

9. The photocurable resin composition according to claim 1, wherein the thermocurable resin has two or more cyclic (thio) ether groups in a molecule.

10. The photocurable resin composition according to claim 9, wherein an amount of the thermocurable resin having two or more cyclic (thio)ether groups in the molecule is 0.6 to 2.5 eq. compared to 1 eq. of the carboxyl group in the resin comprising a carboxyl group.

11. The photocurable resin composition according to claim 10, wherein the amount of the thermocurable resin having two or more cyclic (thio)ether groups in the molecule is 0.8 to 2.0 eq. compared to 1 eq. of the carboxyl group in the resin comprising a carboxyl group.

12. The photocurable resin composition according to claim 1, further comprising a filler.

13. The photocurable resin composition according to claim 12, wherein the filler includes at least one of barium sulfate, silica, talc, titanium oxide, a metal oxide and a metal hydroxide.

14. The photocurable resin composition according to claim 12, wherein an amount of the filler is 75% by mass or less in the total mass of the photocurable resin composition.

15. The photocurable resin composition according to claim 14, wherein the amount of the filler is 0.1 to 60% by mass in the total mass of the photocurable resin composition.

16. The photocurable resin composition according to claim 1, further comprising a colorant.

17. The photocurable resin composition according to claim 16, wherein an amount of the colorant is 0 to 10 parts by mass compared to 100 parts by mass of the resin containing a carboxyl group.

18. The photocurable resin composition according to claim 1, wherein Ar represents phenylene or thienylene.

* * * * *